(12) United States Patent
Lee et al.

(10) Patent No.: US 8,884,286 B2
(45) Date of Patent: Nov. 11, 2014

(54) SWITCHING ELEMENT, DISPLAY SUBSTRATE AND METHOD OF MANUFACTURING THE SAME

(71) Applicant: Samsung Display Co., Ltd., Yongin (KR)

(72) Inventors: Yong-Su Lee, Hwaseong-si (KR); Su-Hyoung Kang, Bucheon-si (KR); Yoon-Ho Khang, Yongin-si (KR); Hyun-Jae Na, Seoul (KR); Sang-Ho Park, Suwon-si (KR); Se-Hwan Yu, Seoul (KR); Myoung-Geun Cha, Seoul (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 0 days.

(21) Appl. No.: 13/838,219

(22) Filed: Mar. 15, 2013

(65) Prior Publication Data
US 2014/0145178 A1 May 29, 2014

(30) Foreign Application Priority Data

Nov. 27, 2012 (KR) .................... 10-2012-0135061

(51) Int. Cl.
*H01L 29/10* (2006.01)
*H01L 29/12* (2006.01)
*H01L 29/786* (2006.01)
*H01L 29/66* (2006.01)

(52) U.S. Cl.
CPC .... *H01L 29/78606* (2013.01); *H01L 29/66969* (2013.01)
USPC .......... 257/43; 257/59; 257/72; 257/E51.006; 257/E29.151; 438/151

(58) Field of Classification Search
USPC ........ 257/43, 59, 72; 438/151, 152, 153, 154, 438/155, 156, 157, 158, 159, 160, 161, 162, 438/163, 164, 165, 166
See application file for complete search history.

(56) References Cited

U.S. PATENT DOCUMENTS

2010/0155710 A1* 6/2010 Lee et al. .................. 257/40
2011/0089403 A1* 4/2011 Woo et al. ................. 257/29
(Continued)

FOREIGN PATENT DOCUMENTS

KR 10-2004-0090063 10/2004
KR 10-2012-0080060 7/2012

OTHER PUBLICATIONS

English Abstract for Publication No. 10-2004-0090063.
(Continued)

*Primary Examiner* — Matthew W Such
*Assistant Examiner* — Samuel Lair
(74) *Attorney, Agent, or Firm* — F. Chau & Associates, LLC

(57) ABSTRACT

A switching element includes an active pattern including a channel portion, a source portion connected to the channel portion, and a drain portion connected to the channel portion, the source portion, a gate electrode overlapping the channel portion of the active pattern, a gate insulation layer disposed between the channel portion of the active pattern and the gate electrode, a source electrode disposed on the source portion of the active pattern to make ohmic contact with the source portion, and a drain electrode disposed on the drain portion of the active pattern to make ohmic contact with the drain portion. The drain portion and the channel portion of the active pattern include the same or substantially the same material.

16 Claims, 17 Drawing Sheets

(56) References Cited

U.S. PATENT DOCUMENTS

| | | |
|---|---|---|
| 2012/0056161 A1 | 3/2012 | Avouris et al. |
| 2012/0153286 A1* | 6/2012 | Yoon et al. ............... 257/59 |
| 2012/0168724 A1* | 7/2012 | Park et al. ............... 257/29 |
| 2012/0181508 A1* | 7/2012 | Chang et al. ............ 257/29 |
| 2013/0001573 A1* | 1/2013 | Lee et al. ............... 257/60 |
| 2013/0032794 A1* | 2/2013 | Lee et al. ............... 257/43 |
| 2013/0161587 A1* | 6/2013 | Xianyu et al. ............ 257/29 |
| 2014/0048799 A1* | 2/2014 | Tour et al. ............... 257/43 |
| 2014/0077161 A1* | 3/2014 | Duan et al. .............. 257/29 |

OTHER PUBLICATIONS

English Abstract for Publication No. 10-2012-0080060.

* cited by examiner

SWITCHING ELEMENT, DISPLAY SUBSTRATE AND METHOD OF MANUFACTURING THE SAME

This application claims priority under 35 U.S.C. §119 to Korean Patent Application No. 10-2012-0135061, filed on Nov. 27, 2012, the disclosure of which is incorporated by reference herein in its entirety.

TECHNICAL FIELD

Exemplary embodiments of the invention relate to a switching element, and more particularly, to a switching element, a display substrate having the switching element, and a method of manufacturing the display substrate.

DISCUSSION OF THE RELATED ART

A liquid crystal display (LCD) panel includes an array substrate having signal lines, thin film transistors and pixel electrodes, an opposite substrate having a common electrode, and a liquid crystal layer disposed between the array substrate and the opposite substrate. A vertical electric field is formed between the common electrode and the pixel electrode and aligns the liquid crystal molecules in the liquid crystal layer. Thin film transistors are used as switching elements for driving an LCD panel. A thin film transistor includes a semiconductor channel layer, a source electrode, a drain electrode and a gate electrode.

SUMMARY

According to an exemplary embodiment of the invention, a switching element includes an active pattern including a channel portion, a source portion connected to the channel portion, and a drain portion connected to the channel portion, the source portion, a gate electrode overlapping the channel portion of the active pattern, a gate insulation layer disposed between the channel portion of the active pattern and the gate electrode, a source electrode disposed on the source portion of the active pattern making ohmic contact with the source portion, and a drain electrode disposed on the drain portion of the active pattern making ohmic contact with the drain portion. The drain portion and the channel portion of the active pattern include the same or substantially the same material.

In an exemplary embodiment of the present invention, the source electrode and the drain electrode each may include graphene.

In an exemplary embodiment of the present invention, the gate insulation layer may be disposed between the source electrode and the drain electrode. A boundary of the gate insulation layer may substantially coincide with a boundary of the gate electrode.

In an exemplary embodiment of the present invention, the switching element may further include gate capping layer disposed on the gate electrode to cover upper and side surfaces of the gate electrode. The gate capping layer may be electrically insulated from the source electrode and the drain electrode.

In an exemplary embodiment of the present invention, the gate capping layer may include graphene.

In an exemplary embodiment of the present invention, the switching element may further include an etch stopper disposed on the channel portion of the active pattern. The etch stopper may contact the channel portion. The etch stopper may be disposed between the source electrode and the drain electrode and may insulate the source electrode from the drain electrode.

In an exemplary embodiment of the present invention, the active pattern may include amorphous oxide having indium (In), zinc (Zn), gallium (Ga) or hafnium (Hf).

In an exemplary embodiment of the present invention, the gate electrode may be disposed opposite to the source electrode and the drain electrode with respect to the active pattern.

In an exemplary embodiment of the present invention, the size of the active pattern may be larger than the size of the gate electrode when viewed in a plan view.

According to an exemplary embodiment of the invention, a display substrate includes a base substrate, a data line disposed on the base substrate, a gate line crossing the data line, a switching element electrically connected to the gate line and the data line, and a pixel electrode electrically connected to the switching element. The switching element includes an active pattern including a channel portion, a source portion connected to the channel portion, and a drain portion connected to the channel portion, the source portion, a gate electrode overlapping the channel portion of the active pattern, a gate insulation layer disposed between the channel portion of the active pattern and the gate electrode, a source electrode disposed on the source portion of the active pattern making ohmic contact with the source portion, and a drain electrode disposed on the drain portion of the active pattern making ohmic contact with the drain portion. The drain portion and the channel portion of the active pattern each include the same or substantially the same material In an exemplary embodiment of the present invention, the display substrate may further include a gate capping layer covering upper and side surfaces of the gate line and upper and side surfaces of the gate electrode. The gate capping layer may include the same or substantially the same material as the source electrode and the drain electrode.

In an exemplary embodiment of the present invention, the display substrate may further include a passivation layer covering the gate capping layer, the source electrode and the drain electrode. The pixel electrode may be electrically connected to the drain electrode through a first contact hole formed through the passivation layer.

In an exemplary embodiment of the present invention, the source electrode and the drain electrode each may include graphene.

In an exemplary embodiment of the present invention, the display substrate may further include an etch stopper disposed on the channel portion of the active pattern, the etch stopper contacting the channel portion. The etch stopper may be disposed between the source electrode and the drain electrode and may insulate the source electrode from the drain electrode.

In an exemplary embodiment of the present invention, the display substrate may further include a data capping layer covering upper and side surfaces of the data line and including graphene.

In an exemplary embodiment of the present invention, the active pattern may include amorphous oxide having indium (In), zinc (Zn), gallium (Ga) or hafnium (Hf).

According to an exemplary embodiment of the invention, a method of manufacturing a display substrate includes providing a data line on a base substrate, providing a first insulation layer on the data line and the base substrate, providing an active pattern on the first insulation layer, the active pattern including a channel portion, a source portion connected to the channel portion and a drain portion connected to the channel portion, the source portion, providing a primitive second insulation layer on the active pattern, providing a gate electrode on the primitive second insulation layer, providing a second insulation layer exposing the source portion and the drain portion of the active pattern, by pattering the primitive second insulation layer, providing a source electrode and a drain electrode on the source portion and the drain portion of the active pattern, respectively, and a third insulation layer covering the source electrode and the drain electrode.

In an exemplary embodiment of the present invention, providing the source electrode and the drain electrode may include providing a gate capping layer covering upper and side surfaces of the gate electrode.

In an exemplary embodiment of the present invention, providing the source electrode and the drain electrode may include providing the source electrode and the drain electrode including graphene, by a acetylene (C2H2) chemical vapor deposition (CVD) with argon (Ar) atmosphere.

In an exemplary embodiment of the present invention, the method further include providing a first contact hole through the third insulation layer to expose the drain electrode, providing a second contact hole through the third insulation layer to expose the source electrode, and providing a pixel electrode on the third insulation layer, the pixel electrode electrically connected to the drain electrode through the first contact hole.

In an embodiment of the present invention, a switching element includes an active pattern, a source electrode and a drain electrode on the active pattern, which are configured to form ohmic contact with the active pattern, an insulating layer on the active pattern between the source electrode and the drain electrode, and a gate electrode on the insulating layer. The source electrode or the drain electrode may include at least one graphene layer. The switching element may further include a graphene layer on the gate electrode.

BRIEF DESCRIPTION OF THE DRAWINGS

The above and other features of the invention will become more apparent by describing in detail exemplary embodiments thereof with reference to the accompanying drawings, in which.

DETAILED DESCRIPTION OF EXAMPLE EMBODIMENTS

Hereinafter, exemplary embodiments of the present invention will be described in further detail with reference to the accompanying drawings. The present invention may, however, be embodied in many different forms and should not be construed as being limited to the embodiments set forth herein. It will be understood that when an element or layer is referred to as being "on" or "connected to" another element or layer, the element or layer can be directly on or connected to another element or layer or intervening elements or layers. Like numbers may refer to like or similar elements throughout the specification and the drawings. As used herein, the singular forms "a," "an" and "the" are intended to include the plural forms as well, unless the context clearly indicates otherwise.

Figure 1:
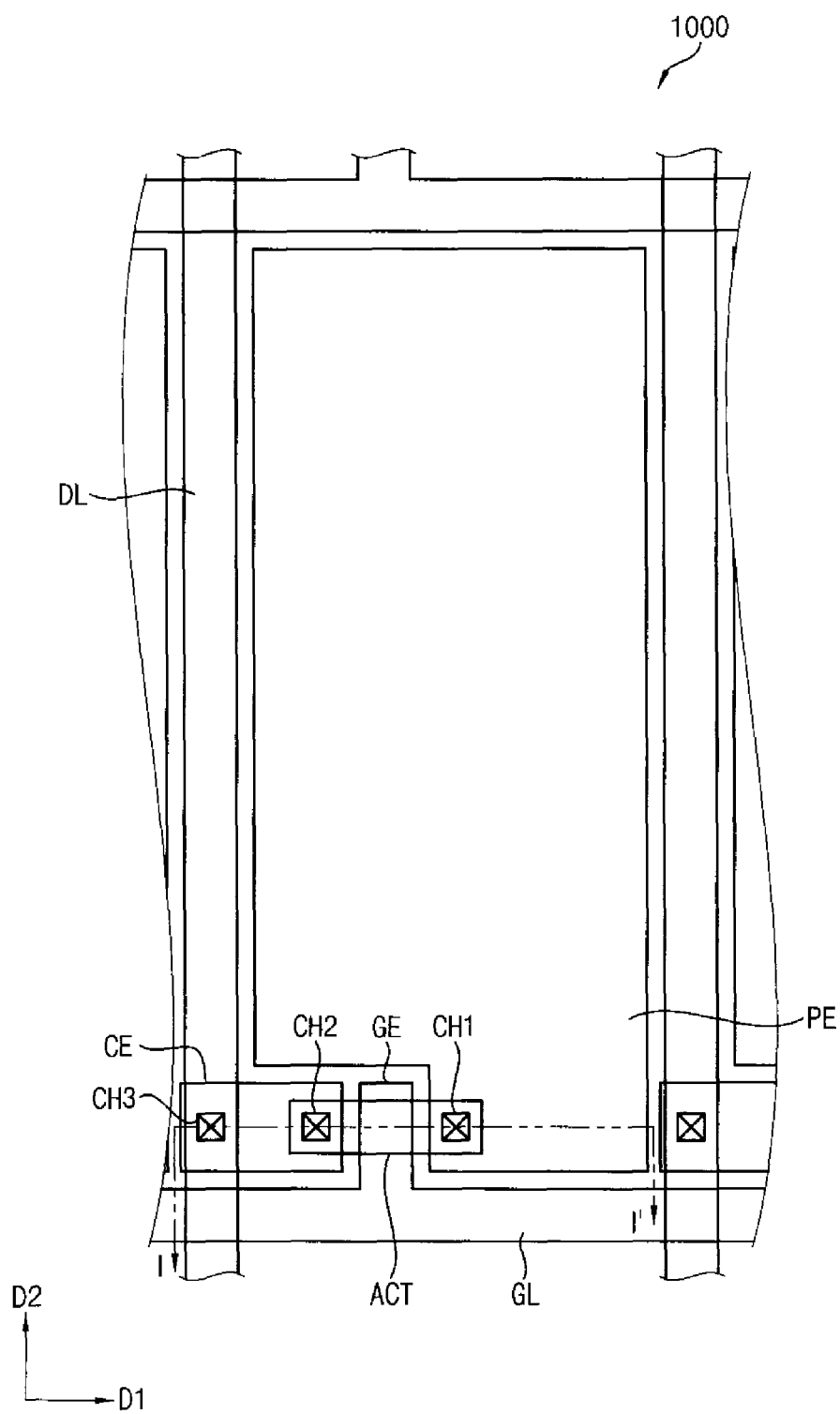
FIG. 1 is a plan view illustrating a display substrate according to an exemplary embodiment of the invention.

FIG. 1 is a plan view illustrating a display substrate according to an exemplary embodiment of the invention.

Referring to FIG. 1, the display substrate 1000 includes a gate line GL, a data line DL, a pixel electrode PE, and a switching element including an active pattern ACT.

The gate line GL extends along a first direction D1. The data line DL extends along a second direction D2 substantially perpendicular to the first direction D1 and crosses the gate line GL.

The gate line GL and the data line DL define a pixel area. Although one pixel area is illustrated in the figures, the display substrate according to an exemplary embodiment of the present invention generally includes a plurality of pixel areas respectively including pixels. The pixel areas are arranged, for example, in a matrix structure having a plurality of rows and columns. The pixel areas may each have substantially the same structure although the color of a color filter portion or the size or shape of a pixel electrode may be changed. For purposes of description, one pixel area will be herein described as an example. Although the pixel area has a rectangular shape in the figures, the pixel area may have various shapes. Further, the pixel area may have a number of modifications in size and/or shape and/or number of field altering slits or other fine features included in the pixel area. For example the pixel areas may have V or Z shapes.

The switching element includes a gate electrode GE, the active pattern ACT, a source electrode and a drain electrode. The gate electrode GE of the switching element protrudes from the gate line GL in a second direction D2. The gate electrode GE overlaps the active pattern ACT.

The pixel electrode PE is formed in the pixel area. The pixel electrode PE is electrically connected to the drain electrode through a first contact hole CH1.

The source electrode is electrically connected to a connecting electrode CE through a second contact hole CH2. The connecting electrode CE is electrically connected to the data line DL through a third contact hole CH3.

Figure 2:
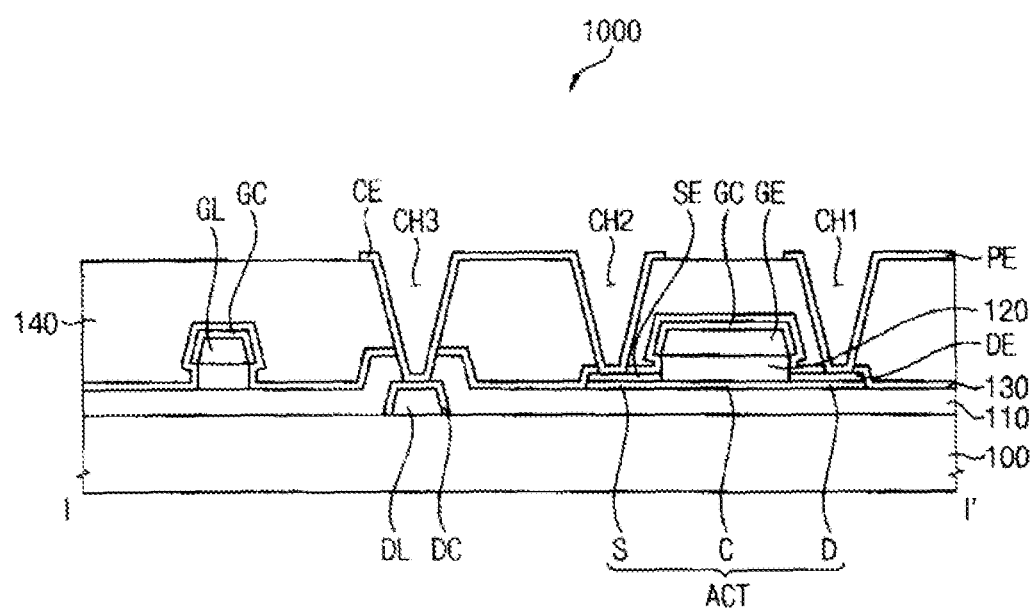
FIG. 2 is a cross-sectional view taken along a line I-I' of FIG. 1.

FIG. 2 is a cross-sectional view taken along a line of FIG. 1.

Referring to FIG. 2, the display substrate 1000 includes a base substrate 100, a data line DL, a data capping layer DC, a first insulation layer 110, an active pattern ACT, a second insulation layer 120, a source electrode SE, a drain electrode DE, a gate electrode GE, a passivation layer 130, a gate capping layer GC, a gate line GL, a planarizing layer 140, a connecting electrode CE, and a pixel electrode PE.

Examples of the base substrate 100 may include a glass substrate, a quartz substrate, a silicon substrate, a plastic substrate or the like.

The data line DL is disposed on the base substrate 100. The data line DL may have a single layer structure including one or more of copper (Cu), silver (Ag), chrome (Cr), molybdenum (Mo), aluminum (Al), titanium (Ti), and manganese (Mn). The data line DL may have a multi-layer structure having a plurality of layers including materials different from each other. For example, the data line DL may include a copper layer and a titanium layer disposed on and/or under the copper layer.

The data capping layer DC covers upper and side surfaces of the data line DL. The data capping layer DC protects the data line DL from unwanted particles during a manufacturing process. The data capping layer DC may include graphene.

The first insulation layer 110 covers the base substrate 100 and the data capping layer DC. The first insulation layer 110 electrically insulates the data line DL from other components. The first insulation layer 110 may include an inorganic insulating material, such as silicon oxide (SiOx) and/or silicon nitride (SiNx). For example, the first insulation layer 110 includes silicon oxide (SiOx), and may have a thickness of about 2000 Å. The first insulation layer 110 may include a plurality of layers including materials different from each other.

The active pattern ACT is disposed on the first insulation layer 110. The active layer ACT may include an oxide semiconductor. The oxide semiconductor may include an amorphous oxide including one or more of indium (In), zinc (Zn), gallium (Ga), tin (Sn) and hafnium (Hf). For example, the oxide semiconductor may include an amorphous oxide including indium (In), zinc (Zn) and gallium (Ga), or an amorphous oxide including indium (In), zinc (Zn) and hafnium (Hf). The oxide semiconductor may include an oxide, such as indium zinc oxide (InZnO), indium gallium oxide (InGaO), indium tin oxide (InSnO), zinc tin oxide (ZnSnO), gallium tin oxide (GaSnO) and gallium zinc oxide (GaZnO). For example, the active layer ACT may include indium gallium zinc oxide (IGZO), and may have a thickness of about 500 Å.

The active pattern ACT includes a channel portion C, a source portion S connected to the channel portion C, and a drain portion D connected to the channel portion C. The source portion S and channel portion C may include the same or substantially the same material. The drain portion D and channel portion C may include the same or substantially the same material.

The source electrode SE is disposed on the source portion S of the active pattern ACT. A boundary of the source electrode SE may coincide with a boundary of the source portion S. The source electrode SE may have ohmic contact with the source portion S of the active pattern ACT. Thus, superior electrical properties between the source portion S of the active pattern ACT and source electrode SE may be achieved. The source electrode SE may include graphene. For example, the source electrode SE may have a plurality of graphene layers.

The drain electrode DE is disposed on the drain portion D of the active pattern ACT. A boundary of the drain electrode DE may coincide with a boundary of the drain portion D. The drain electrode DE may have ohmic contact with the drain portion D of the active pattern ACT. Thus, superior electrical properties between the drain portion D of the active pattern ACT and drain electrode DE may be achieved. The drain electrode DE may include graphene. For example, the drain electrode DE may have a plurality of graphene layers.

The second insulation layer 120 is disposed on the channel portion C of the active pattern ACT. The second insulation layer 120 is disposed between the first insulation layer 110 and the gate line GL. The second insulation layer 120 is disposed adjacent to the source electrode SE and the drain electrode DE, and the second insulation layer 120 is disposed under the gate electrode GE. The second insulation layer 120 insulates the gate electrode GE from other components. When viewed in a plan view, the second insulation layer 120 may have a size and shape substantially the same as a size and shape of the gate electrode and the gate line GL.

The second insulation layer 120 may include an inorganic insulating material. For example, the second insulation layer 120 may include silicon oxide (SiOx), and the second insulation layer 120 may have a thickness of about 2000 Å. The second insulation layer 120 may include a plurality of layers including materials different from each other.

The gate electrode GE is disposed on the second insulation layer 120. The gate electrode GE is electrically connected to the gate line GL. The gate electrode GE may include material the same or substantially the same as the gate line GL.

The active pattern ACT, the source electrode SE, the drain electrode DE and the gate electrode GE form a switching element. A gate signal is applied to the gate electrode GE through the gate line GL, and the channel portion C of the active pattern ACT is thus rendered conductive. Accordingly, a data signal from the data line DL is applied to the pixel electrode PE through the connecting electrode CE, the source electrode SE, the source portion S of the active pattern ACT, the channel portion C of the active pattern ACT, the drain portion D of the active pattern. ACT and the drain electrode DE.

The gate line GL is disposed on the second insulation layer 120. The gate line GL may have a single layer structure including one or more of copper (Cu), silver (Ag), chrome (Cr), molybdenum (Mo), aluminum (Al), titanium (Ti), and manganese (Mn). The gate line GL may have a multi-layer structure having a plurality of layers including materials different from each other. For example, the gate line GL may include a copper layer and a titanium layer disposed on and/or under the copper layer. The gate line GL may have a thickness of about 3300 Å.

The gate capping layer GC covers upper and side surfaces of the gate line GL. The gate capping layer GC covers upper and side surfaces of the gate electrode GE. The gate capping layer GC protects the gate line GL and the gate electrode GE from exposure to unwanted particles during a manufacturing process. The gate capping layer GC may include graphene. The gate capping layer GC does not contact the source electrode SE or the drain electrode DE.

The passivation layer 130 covers the gate capping layer GC, the switching element and the gate line GL. The passivation layer 130 may include at least one of silicon nitride (SiNx), silicon oxide (SiOx) and aluminum oxide. For example, the passivation layer 130 includes silicon nitride (SiNx), and has a thickness of about 2000 Å.

The planarizing layer 140 is disposed on the passivation layer 130. The planarizing layer 140 planarizes an upper surface of the display substrate 1000, thus preventing formation of a step shape. Therefore, a disconnection of a signal line, which may be caused by a step shape, may be prevented. The first planarizng layer 140 may be an insulation layer including an organic insulating material.

A first contact hole CH1 is formed through the planarizing layer 140 and the passivation layer 130. The first contact hole CH1 exposes a portion of the drain electrode DE. A second contact hole CH2 is formed through the planarizing layer 140 and the passivation layer 130. The second contact hole CH2 exposes a portion of the source electrode SE. A third contact hole CH3 is formed through the planarizing layer 140, the passivation layer 130, and the first insulation layer 110. The third contact hole CH3 exposes a portion of the data capping layer DC on the data line DL.

The pixel electrode PE is disposed on the planarizing layer 140 and is electrically connected to the drain electrode DE through the first contact hole CH1. The pixel electrode PE may include a transparent conductive material, such as indium tin oxide (ITO), indium zinc oxide (IZO), etc. The pixel electrode PE may include titanium (Ti) and/or molybdenum titanium (MoTi).

The connecting electrode CE is disposed on the planarizing layer 140 and connects the data capping layer DC on the data line DL to the source electrode SE through the second contact hole CH2 and the third contact hole CH3. Thus, the data line DL is electrically connected to the source electrode SE. The connecting electrode CE may include the same or substantially the same materials as the pixel electrode PE. For example, the connecting electrode CE may include indium tin oxide (ITO) indium zinc oxide (IZO), etc. The connecting electrode CE may include titanium (Ti) and/or molybdenum titanium (MoTi).

Figure 3:
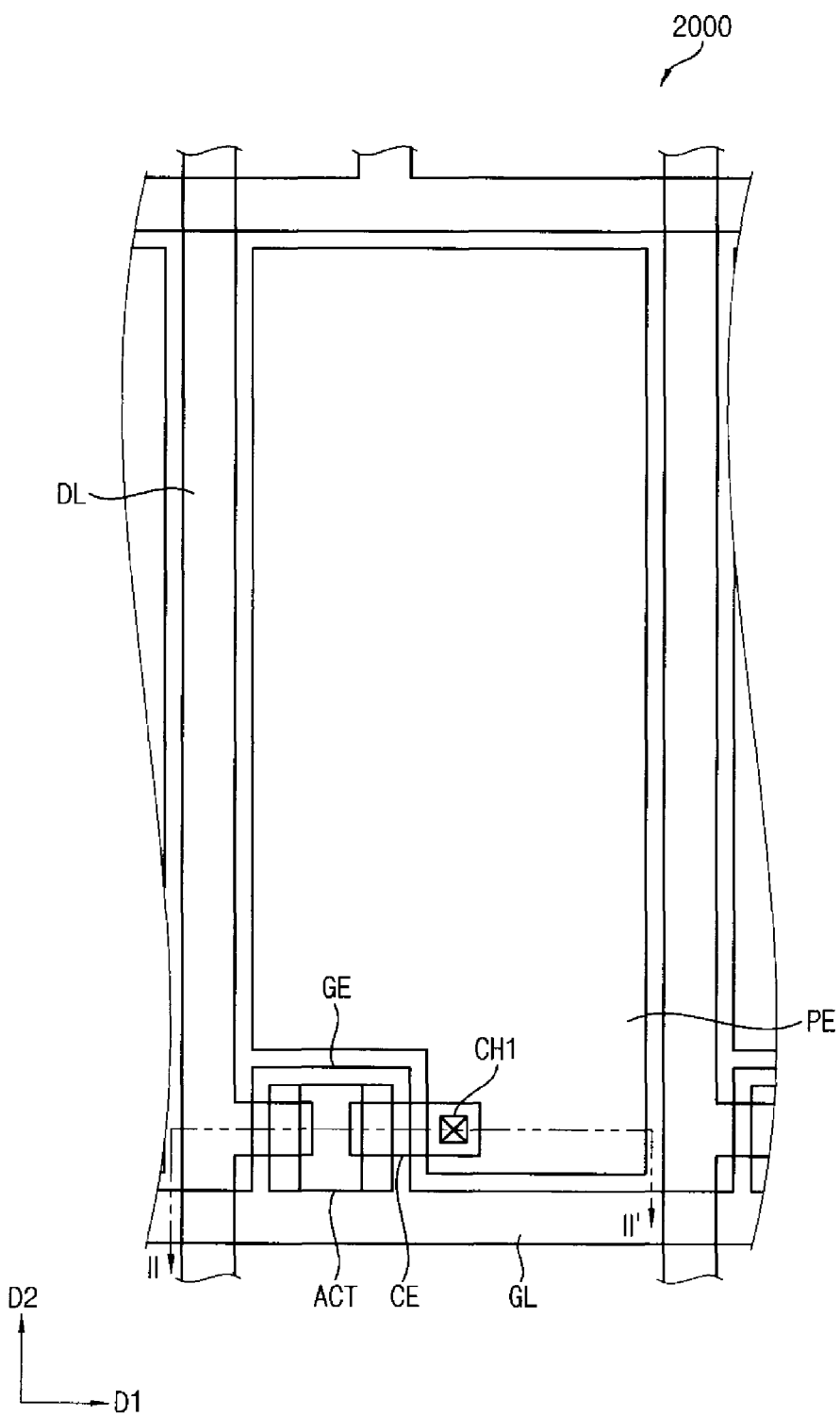
FIG. 3 is a plan view illustrating a display substrate according to an exemplary embodiment of the invention.

FIG. 3 is a plan view illustrating a display substrate according to an exemplary embodiment of the present invention.

Referring to FIG. 3, the display substrate 2000 includes a gate line GL, a data line DL, a connecting electrode CE, a pixel electrode PE, and a switching element including an active pattern ACT.

The gate line GL extends along a first direction D1. The data line DL extends along a second direction D2 substantially perpendicular to the first direction D1 and crosses the gate line GL.

The gate line GL and the data line DL defines a pixel area. Although one pixel area is illustrated in the figures, the display substrate according to an exemplary embodiment of the present invention generally includes a plurality of pixel areas respectively including pixels. The pixel areas are arranged, for example, in a matrix structure having a plurality of rows and columns. The pixel areas have substantially the same structure although the color of a color filter portion or the size or shape of a pixel electrode may be changed. For purposes of description, one pixel area will be herein described as an example. Although the pixel area has a rectangular shape in the figures, the pixel area may have various shapes. Further, the pixel area may have a number of modifications in size and/or shape and/or number of field altering slits or other fine features included in the pixel area. For example the pixel areas may have V or Z shapes.

The switching element includes a gate electrode GE, the active pattern ACT, a source electrode and a drain electrode. The gate electrode GE of the switching element protrudes from the gate line GL in a second direction D2. The gate electrode GE overlaps the active pattern ACT.

The pixel electrode PE is formed in the pixel area. The pixel electrode PE is electrically connected to the connecting electrode CE through a first contact hole CH1.

The connecting electrode CE is electrically connected to the drain electrode DE.

A portion of the data line DL protrudes in the first direction D1, and the protruded portion of the data line DL is connected to the source electrode.

Figure 4:
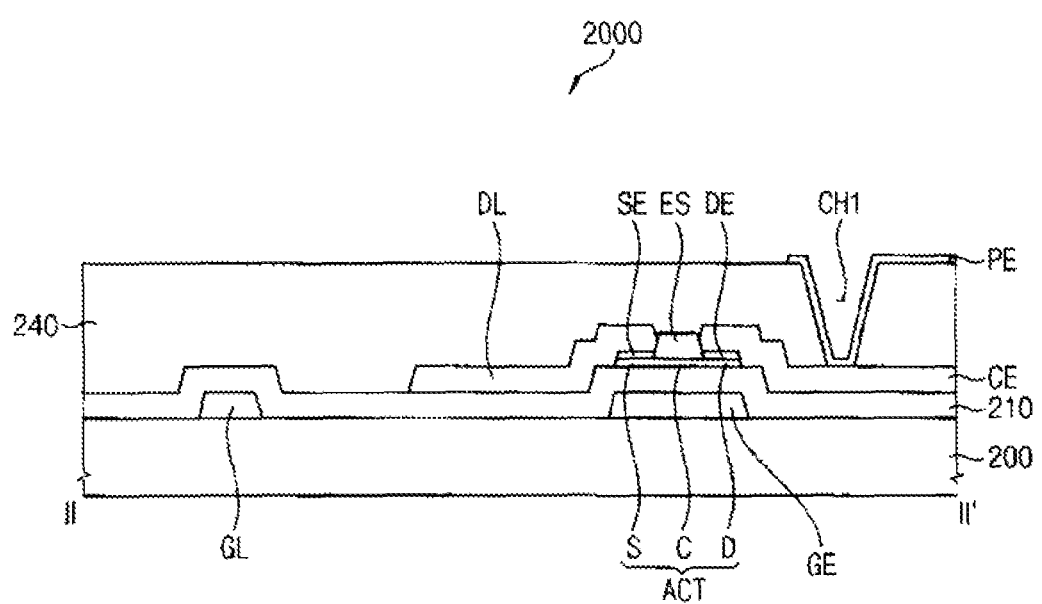
FIG. 4 is a cross-sectional view taken along a line II-II' of FIG. 3.

FIG. 4 is a cross-sectional view taken along a line II-II' of FIG. 3.

Referring to FIG. 4, the display substrate 2000 includes a base substrate 200, a gate line GL, a gate electrode GE, a first insulation layer 210, an active pattern ACT, a source electrode SE, a drain electrode DE, an etch stopper ES, a data line DL, a connecting electrode CE, a second insulation layer 240, and a pixel electrode PE.

Examples of the base substrate 200 may include a glass substrate, a quartz substrate, a silicon substrate, a plastic substrate or the like.

The gate line GL is disposed on the base substrate 200. The gate line GL may have a single layer structure including one or more of copper (Cu), silver (Ag), chrome (Cr), molybdenum (Mo), aluminum (Al), titanium (Ti), and manganese (Mn). The gate line GL may have a multi-layer structure having a plurality of layers including materials different from each other. For example, the gate line GL may include a copper layer and a titanium layer disposed on and/or under the copper layer.

The gate electrode GE is disposed on the base substrate 200. The gate electrode GE is electrically connected to the gate line GL. The gate electrode GE may include the same or substantially the same material as the gate line GL.

The first insulation layer 210 covers the base substrate 200, the gate line GL and the gate electrode GE. The first insulation layer 210 may include an inorganic insulating material, such as silicon oxide (SiOx) and/or silicon nitride (SiNx). For example, the first insulation layer 210 includes silicon oxide (SiOx), and may have a thickness of about 2000 Å. The first insulation layer 210 may include a plurality of layers including materials different from each other.

The active pattern ACT is disposed on the first insulation layer 210. The active layer ACT may include an oxide semiconductor. The oxide semiconductor may include an amorphous oxide including at least one of indium (In), zinc (Zn), gallium (Ga), tin (Sn) and hafnium (Hf). For example, the oxide semiconductor may include an amorphous oxide including indium (In), zinc (Zn) and gallium (Ga), or an amorphous oxide including indium (In), zinc (Zn) and hafnium (Hf). The oxide semiconductor may include an oxide, such as indium zinc oxide (InZnO), indium gallium oxide (InGaO), indium tin oxide (InSnO), zinc tin oxide (ZnSnO), gallium tin oxide (GaSnO) and gallium zinc oxide (GaZnO). For example, the active layer ACT may include indium gallium zinc oxide (IGZO), and may have a thickness of about 500 Å.

The active pattern ACT includes a channel portion C, a source portion S connected to the channel portion C, and a drain portion D connected to the channel portion C. The source portion S and channel portion C may include the same or substantially the same material. The drain portion D and channel portion C may include the same or substantially the same material. The active pattern ACT overlaps the gate electrode GE.

The source electrode SE is disposed on the source portion S of the active pattern ACT. A boundary of the source electrode SE may coincide with a boundary of the source portion S. The source electrode SE may have ohmic contact with the source portion S of the active pattern ACT. Thus, superior electrical properties between the source portion S of the active pattern ACT and source electrode SE may be achieved. The source electrode SE may include graphene. For example, the source electrode SE may have a plurality of graphene layers.

The drain electrode DE is disposed on the drain portion D of the active pattern ACT. A boundary of the drain electrode DE may coincide with a boundary of the drain portion D. The drain electrode DE may have ohmic contact with the drain portion D of the active pattern ACT. Thus, superior electrical properties between the drain portion D of the active pattern ACT and drain electrode DE may be achieved. The drain electrode DE may include graphene. For example, the drain electrode DE may have a plurality of graphene layers.

The active pattern ACT, the source electrode SE, the drain electrode DE and the gate electrode GE form a switching element. A gate signal is applied to the gate electrode GE through the gate line GL, and the channel portion C of the active pattern ACT is thus rendered conductive. Accordingly, a data signal from the data line DL is applied to the pixel electrode PE through the source electrode SE, the source portion S of the active pattern ACT, the channel portion C of the active pattern ACT, the drain portion D of the active pattern ACT, the drain electrode DE and the connecting electrode CE.

The etch stopper ES is disposed on the channel portion C of the active pattern ACT. The etch stopper ES is disposed between the source electrode SE and the drain electrode DE and separates the source electrode SE and the drain electrode DE from each other. The etch stopper ES may include an inorganic insulating material, such as silicon oxide (SAN) and/or silicon nitride (SiNx).

The data line DL is disposed on the first insulation layer 210. A portion of the data line DL is protruded and is disposed on the source electrode SE. The protruded portion of the data line DL is electrically connected to the source electrode SE. The data line DL may have a single layer structure including one or more of copper (Cu), silver (Ag), chrome (Cr), molybdenum (Mo), aluminum (Al), titanium (Ti), and manganese (Mn). The data line DL may have a multi-layer structure having a plurality of layers including materials different from each other. For example, the data line DL may include a copper layer and a titanium layer disposed on and/or under the copper layer.

The connecting electrode CE is disposed on the first insulation layer 210 and the drain electrode DE, and electrically connected to the drain electrode DE. The connecting electrode CE is spaced apart from the drain electrode DE by the etch stopper ES. The connecting electrode CE may include a material the same or substantially the same as the data line DL.

The second insulation layer 240 is disposed on the first insulation layer 210, the drain electrode DE, the connecting electrode CE and the etch stopper ES. The second insulation layer 240 protects the display substrate 2000, and substantially planarizes an upper surface of the display substrate 2000, thus preventing formation of a step shape. Therefore, a disconnection of a signal line, which may be caused by a step shape, may be prevented. The second insulation layer 240 may include a plurality of layers. For example, the second insulation layer 240 may include an inorganic insulation layer and an organic insulation layer disposed on the inorganic insulation layer.

The first contact hole CH1 is formed through the second insulation layer 240 and exposes a portion of the connecting electrode CE.

The pixel electrode PE is disposed on the second insulation layer 240, and electrically connected to the connecting electrode CE through the first contact hole CH1. The pixel electrode PE may include a transparent conductive material, such as indium tin oxide (ITO), indium zinc oxide (IZO) and etc. The pixel electrode PE may include titanium (Ti) and/or molybdenum titanium (MoTi).

Figure 5:
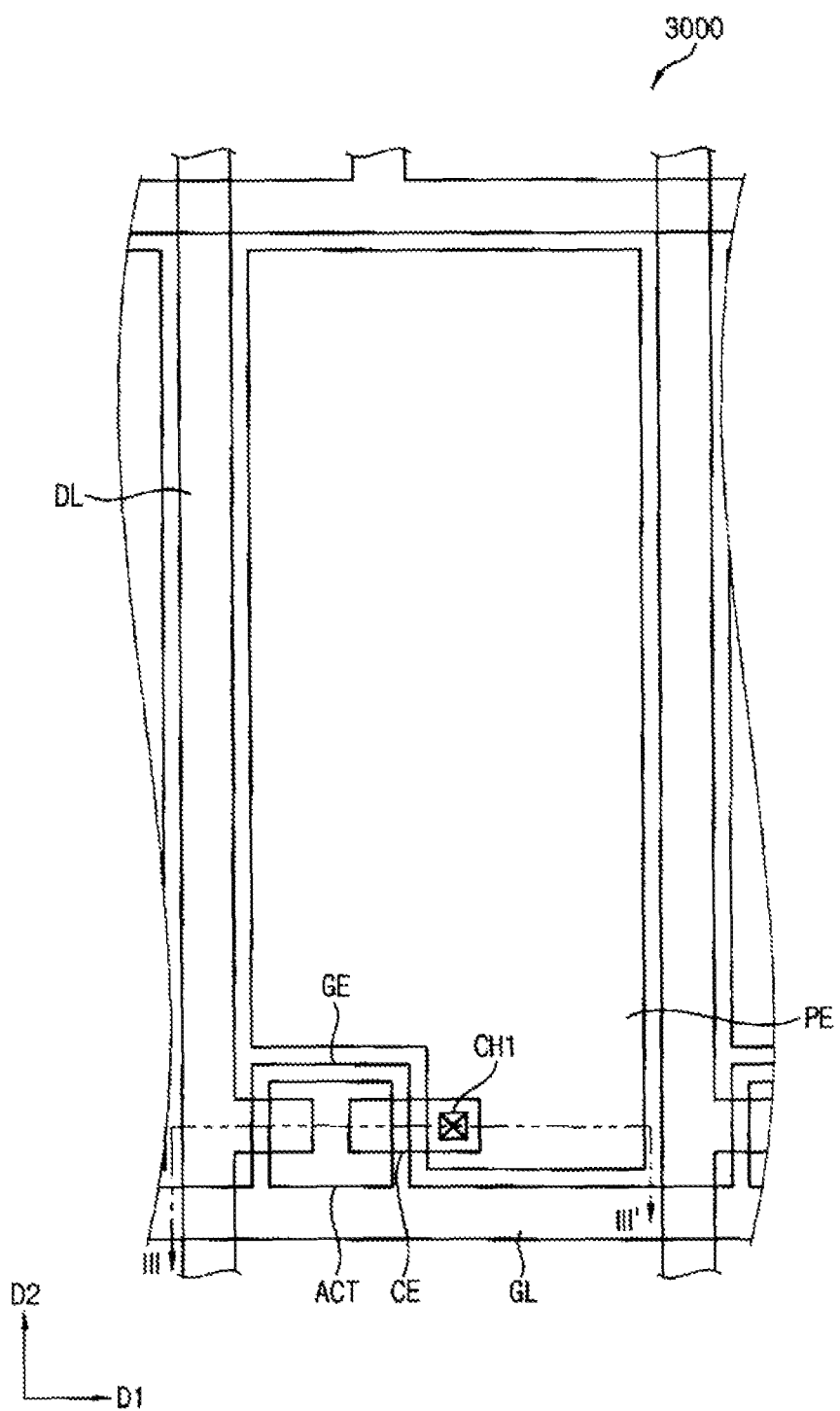
FIG. 5 is a plan view illustrating a display substrate according to an exemplary embodiment of the invention.

FIG. 5 is a plan view illustrating a display substrate according to an exemplary embodiment of the invention.

Referring to FIG. 5, the display substrate 3000 includes a gate line GL, a data line DL, a connecting electrode CE, a pixel electrode PE, and a switching element including an active pattern ACT.

The gate line GL extends along a first direction D1. The data line DL extends along a second direction D2 substantially perpendicular to the first direction D1 and crosses the gate line GL.

The gate line GL and the data line DL defines a pixel area. Although one pixel area is illustrated in the figures, the display substrate according to an exemplary embodiment generally includes a plurality of pixel areas respectively including pixels. The pixel areas are arranged, for example, in a matrix structure having a plurality of rows and columns. The pixel areas have substantially the same structure although the color of a color filter portion or the size or shape of a pixel electrode may be changed. For purposes of description, one pixel area will be herein described as an example. Although the pixel area has a rectangular shape in the figures, the pixel area may have various shapes. Further, the pixel area may have a number of modifications in size and/or shape and/or number of field altering slits or other fine features included in the pixel area. For example the pixel areas may have V or Z shapes.

The switching element includes a gate electrode GE, the active pattern. ACT, a source electrode and a drain electrode. The gate electrode GE of the switching element protrudes from the gate line GL in a second direction D2. The gate electrode GE overlaps the active pattern ACT.

The pixel electrode PE is formed in the pixel area. The pixel electrode PE is electrically connected to the connecting electrode CE through a first contact hole CH1.

The connecting electrode CE is electrically connected to the drain electrode DE.

A portion of the data line DL protrudes in the first direction D1, and the protruded portion of the data line DL is connected to the source electrode.

Figure 6:
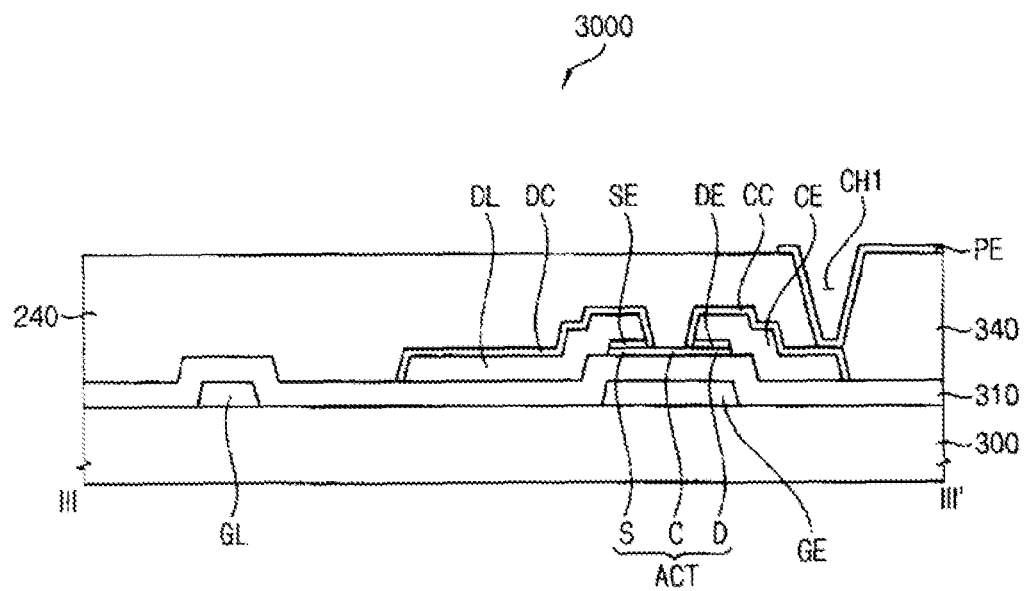
FIG. 6 is a cross-sectional view taken along a line of FIG. 5.

FIG. 6 is a cross-sectional view taken along a line of FIG. 5.

Referring to FIG. 6, the display substrate 3000 includes a base substrate 300, a gate line GL, a gate electrode GE, a first insulation layer 310, an active pattern ACT, a source electrode SE, a drain electrode DE, a data line DL, a data capping layer DC, a connecting electrode CE, a connecting electrode capping layer CC, a second insulation layer 340, and a pixel electrode PE.

Examples of the base substrate 300 may include a glass substrate, a quartz substrate, a silicon substrate, a plastic substrate or the like.

The gate line GL is disposed on the base substrate 200. The gate line GL may have a single layer structure including one or more of copper (Cu), silver (Ag), chrome (Cr), molybdenum (Mo), aluminum (Al), titanium (Ti), and manganese (Mn). The gate line GL may have a multi-layer structure having a plurality of layers including materials different from each other. For example, the gate line GL may include a copper layer and a titanium layer disposed on and/or under the copper layer.

The gate electrode GE is disposed on the base substrate 300. The gate electrode GE is electrically connected to the gate line GL. The gate electrode GE may include the same or substantially the same material as the gate line GL.

The first insulation layer 310 covers the base substrate 300, the gate line GL and the gate electrode GE. The first insulation layer 310 may include an inorganic insulating material, such as silicon oxide (SiOx) and/or silicon nitride (SiNx). For example, the first insulation layer 310 includes silicon oxide (SiOx), and may have a thickness of about 2000 Å. The first insulation layer 310 may include a plurality of layers including materials different from each other.

The active pattern ACT is disposed on the first insulation layer 310. The active layer ACT may include an oxide semiconductor. The oxide semiconductor may include an amorphous oxide including at least one of indium (In), zinc (Zn), gallium (Ga), tin (Sn) and hafnium (Hf). For example, the oxide semiconductor may include an amorphous oxide including indium (In), zinc (Zn) and gallium (Ga), or an amorphous oxide including indium (In), zinc (Zn) and hafnium (Hf). The oxide semiconductor may include an oxide, such as indium zinc oxide (InZnO), indium gallium oxide (InGaO), indium tin oxide (InSnO), zinc tin oxide (ZnSnO), gallium tin oxide (GaSnO) and gallium zinc oxide (GaZnO). For example, the active layer ACT may include indium gallium zinc oxide (IGZO), and may have a thickness of about 500 Å.

The active pattern ACT includes a channel portion C, a source portion S connected to the channel portion C, and a drain portion D connected to the channel portion C. The source portion S and channel portion C may include the same or substantially the same material. The drain portion D and channel portion C may include the same or substantially the same material. The active pattern ACT overlaps the gate electrode GE.

The source electrode SE is disposed on the source portion S of the active pattern ACT. A boundary of the source electrode SE may coincide with a boundary of the source portion S. The source electrode SE may have ohmic contact with the source portion S of the active pattern ACT. Thus, superior electrical properties between the source portion S of the active pattern ACT and source electrode SE may be achieved. The source electrode SE may include graphene. For example, the source electrode SE may have a plurality of graphene layers.

The drain electrode DE is disposed on the drain portion D of the active pattern ACT. A boundary of the drain electrode DE may coincide with a boundary of the drain portion D. The drain electrode DE may have ohmic contact with the drain portion D of the active pattern ACT. Thus, superior electrical properties between the drain portion D of the active pattern ACT and drain electrode DE may be achieved. The drain electrode DE may include graphene. For example, the drain electrode DE may have a plurality of graphene layers.

The active pattern ACT, the source electrode SE, the drain electrode DE and the gate electrode GE form a switching element. A gate signal is applied to the gate electrode GE through the gate line GL, and the channel portion C of the active pattern ACT is thus rendered conductive. Accordingly, a data signal from the data line DL is applied to the pixel electrode PE through the source electrode SE, the source portion S of the active pattern ACT, the channel portion C of the active pattern ACT, the drain portion D of the active pattern ACT, the drain electrode DE and the connecting electrode CE.

The data line DL is disposed on the first insulation layer 310. A portion of the data line DL is protruded and is disposed on the source electrode SE. The protruded portion of the data line DL is electrically connected to the source electrode SE. The data line DL may have a single layer structure including one or more of copper (Cu), silver (Ag), chrome (Cr), molybdenum (Mo), aluminum (Al), titanium (Ti), and manganese (Mn). The data line DL may have a multi-layer structure having a plurality of layers including materials different from each other. For example, the data line DL may include a copper layer and a titanium layer disposed on and/or under the copper layer.

The connecting electrode CE is disposed on the first insulation layer 310 and the drain electrode DE, and is electrically connected to the drain electrode DE. The connecting electrode CE may include a material the same or substantially the same as the data line DL.

The data capping layer DC covers upper and side surfaces of the data line DL. The data capping layer DC protects the data line DL from unwanted particles during a manufacturing process. The data capping layer DC may include graphene.

The connecting electrode capping layer CC covers upper and side surfaces of the connecting electrode CE. The connecting electrode capping layer CC protects the connecting electrode CE from unwanted particles during a manufacturing process. The connecting electrode capping layer CC may include a material the same or substantially the same as the data capping layer DC. For example, the connecting electrode capping layer CC may include graphene.

The second insulation layer 340 is disposed on the first insulation layer 310, the data capping layer DC, the connecting electrode capping layer CC and the channel portion C of the active pattern ACT. The second insulation layer 340 protects the display substrate 3000, and substantially planarizes an upper surface of the display substrate 3000, thus preventing formation of a step shape. Therefore, a disconnection of a signal line, which may be caused by a step shape, may be prevented. The second insulation layer 340 may include a plurality layers. For example, the second insulation layer 340 may include an inorganic insulation layer and an organic insulation layer disposed on the inorganic insulation layer.

The first contact hole CH1 is formed through the second insulation layer 340 and exposes a portion of the connecting electrode capping layer CC.

The pixel electrode PE is disposed on the second insulation layer 340, and is electrically connected to the connecting electrode capping layer CC on the connecting electrode CE through the first contact hole CH1. The pixel electrode PE may include a transparent conductive material, such as indium tin oxide (ITO), indium zinc oxide (IZO) and etc. The pixel electrode PE may include titanium (Ti) and/or molybdenum titanium (MoTi).

FIGS. 7A to 7M are cross-sectional views illustrating a method of manufacturing the display substrate of FIGS. 1 and 2.

Figure 7A:
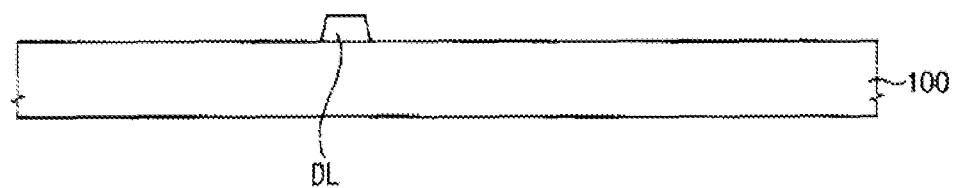
FIGS. 7A to 7M are cross-sectional views illustrating a method of manufacturing the display substrate of FIGS. 1 and 2.

Referring to FIG. 7A, a data metal layer is formed on a base substrate 100. Examples of the base substrate 100 may include a glass substrate, a quartz substrate, a silicon substrate, a plastic substrate or the like. The data metal layer may be formed by a sputtering process, or the like.

The data metal layer may have a single layer structure including one or more of copper (Cu), silver (Ag), chrome (Cr), molybdenum (Mo), aluminum (Al), titanium (Ti), and manganese (Mn). The data metal layer may have a multi-layer structure having a plurality of layers including materials different from each other.

A data line DL is formed by pattering the data metal layer. For example, a photoresist composition is coated on the data metal layer to form a photoresist pattern having a shape corresponding to the data line DL. Thereafter, the data metal layer, which is not covered by the photoresist pattern, is etched to form the data line DL.

Figure 7B:
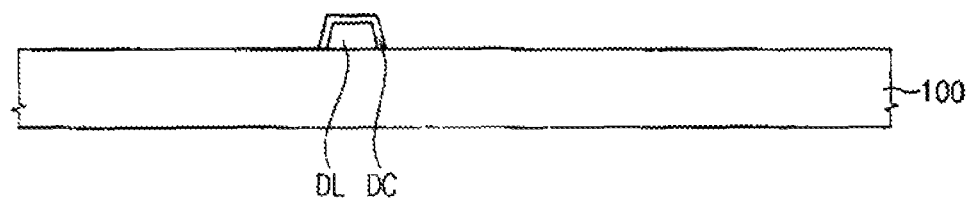

Referring to FIG. 7B, a data capping layer DC is formed on the data line DL to cover upper and side surfaces of the data line DL. The data capping layer DC may include graphene. For example, graphene is selectively grown on the data line DL to form the data capping layer DC. When the data line DL includes copper (Cu), the data capping layer DC may be formed under a condition that graphene selectively grows on a surface of copper. For example, the data capping layer DC may be formed by a acetylene (C2H2) chemical vapor deposition (CVD) process in an argon (Ar) atmosphere at a temperature of about 300 degrees Celsius to about 400 degrees Celsius.

Figure 7C:
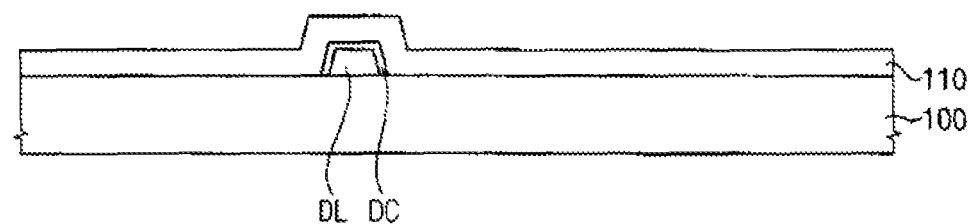

Referring to FIG. 7C, a first insulation layer 110 is formed covering the base substrate 100 and the data capping layer DC. The first insulation layer 110 may include an inorganic insulating material. For example, the first insulation layer 110 may include silicon oxide (SiOx) and have a thickness of about 2000 Å.

Figure 7D:
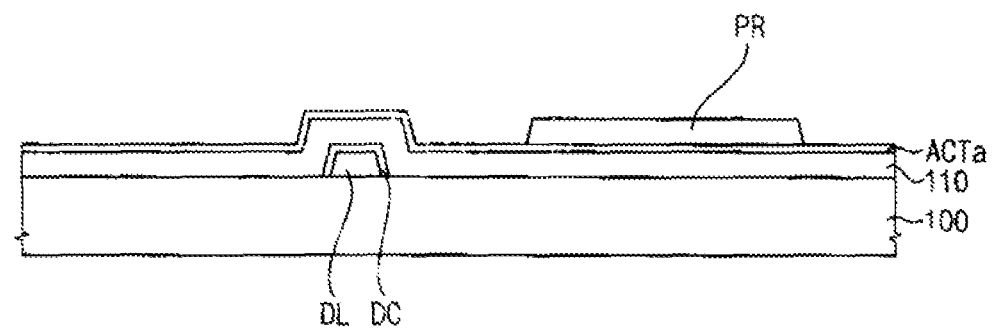

Referring to FIG. 7D, an active layer ACTa is formed on the first insulation layer 110. The active layer ACTa may include a metal oxide semiconductor. For example, the metal oxide semiconductor may include an oxide of zinc, indium, gallium, tin, titanium, phosphor or a combination thereof. For example, the metal oxide semiconductor may include at least one of zinc oxide (ZnO), zinc tin oxide (ZTO), zinc indium oxide (ZIO), indium oxide (Ino), titanium oxide (TiO), indium gallium zinc oxide (IGZO) and indium zinc tin oxide (IZTO).

The active layer ACTa may be formed through a chemical vapor deposition (CVD) process, a plasma enhanced chemical vapor deposition (PECVD) process, a solution coating process, or the like.

A photoresist pattern PR corresponding to an active pattern (refers to ACT of FIG. 7E) is formed on the active layer ACTa.

Figure 7E:
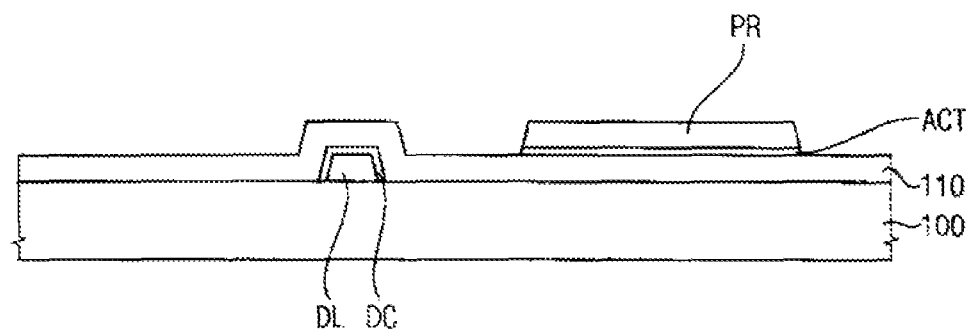

Referring to FIG. 7E, the active pattern ACT is formed by patterning the active layer ACTa. For example, an exposed portion of the active pattern ACT is etched by using the photoresist pattern PR as a mask. Accordingly, an upper surface of the first insulation layer 110 is partially exposed. Thereafter, the photoresist pattern PR is removed.

Figure 7F:
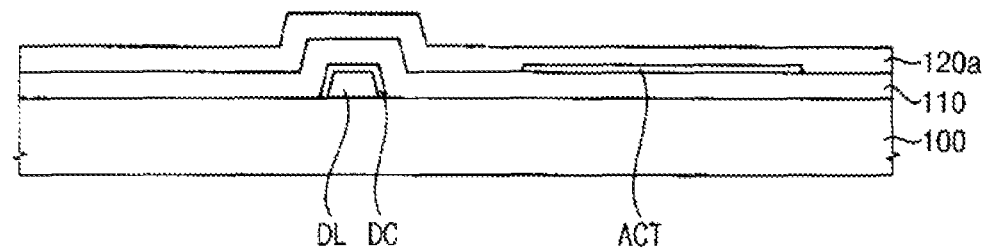

Referring to FIG. 7F, a primitive second insulation layer 120a is formed on the first insulation layer 110 and the active pattern ACT. The primitive second insulation layer 120a may include an inorganic insulating material. For example, the primitive second insulation layer 120a may include silicon oxide (SiOx) and have thickness less than 2000□. The primitive second insulation layer 120a may have a multi-layer structure having a plurality of layers including materials different from each other.

Figure 7G:
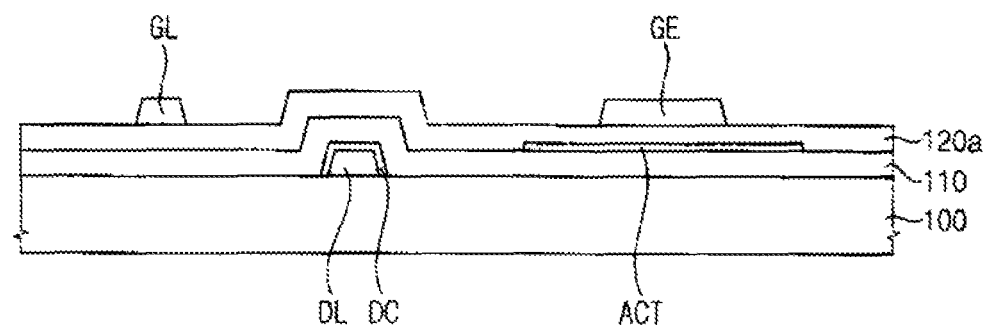

Referring to FIG. 7G, a gate metal layer is formed on the primitive second insulation layer 120a. The gate metal layer may have a single layer structure including one or more of copper (Cu), silver (Ag), chrome (Cr), molybdenum (Mo), aluminum (Al), titanium (Ti), and manganese (Mn). The gate metal layer may have a multi-layer structure having a plurality of layers including materials different from each other.

A gate line GL and a gate electrode GE are formed by patterning the gate metal layer. For example, a photoresist composition is coated on the gate metal layer to form a photoresist pattern having a shape corresponding to the gate line GL and the gate electrode GE. Thereafter, the gate metal layer, which is not covered by the photoresist pattern, is etched to form the gate line GL and the gate electrode GE.

Figure 7H:
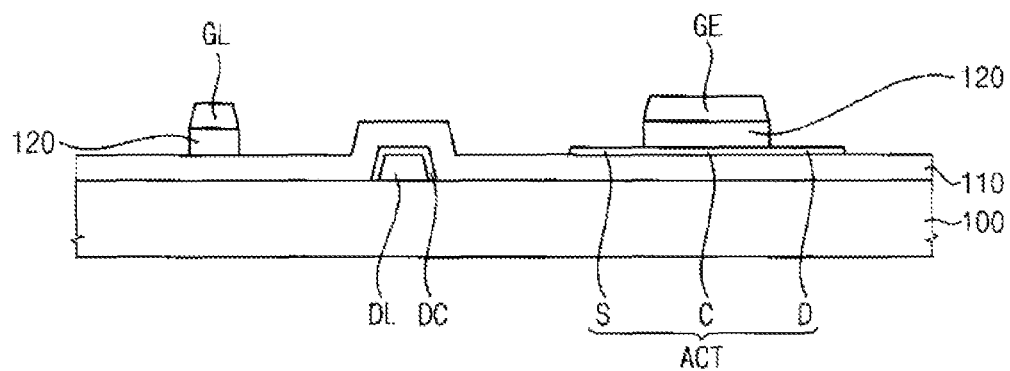

Referring to FIG. 7H, a second insulation layer 120 is formed by patterning the primitive second insulation layer 120a using the gate electrode GE and the gate line GL as a mask. Thus, the second insulation layer 120 has substantially the same size and shape as the gate electrode GE and the gate line GL.

While the primitive second insulation layer 120a is patterned, a source portion S and a drain portion D of the active pattern ACT may be exposed. However, the primitive second insulation layer 120a includes a material different from the active pattern ACT, and thus, the source portion S and the drain portion D of the active pattern ACT are not etched due to etching selectivity.

Figure 7I:
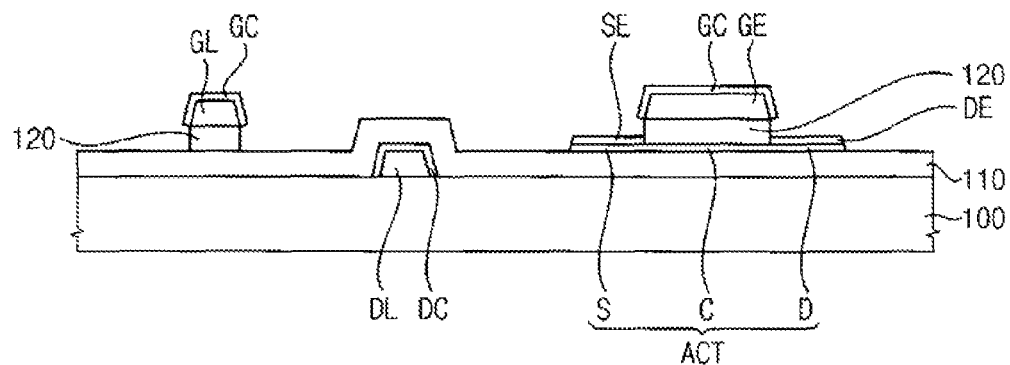

Referring to FIG. 7I, a source electrode SE and a drain electrode DE are formed on the source portion S and the drain portion D, respectively, of the active pattern ACT. The source electrode SE and the drain electrode DE may include graphene. For example, graphene is selectively grown on the source portion S and the drain portion D of the active pattern ACT to form the source electrode SE and the drain electrode DE. When the active pattern ACT includes indium gallium zinc oxide (IGZO), the source electrode SE and the drain electrode DE may be formed under a condition that graphene selectively grows on a surface of indium gallium zinc oxide. For example, the source electrode SE and the drain electrode DE may be formed by a acetylene (C2H2) chemical vapor deposition (CVD) process in an argon (Ar) atmosphere at a temperature of about 300 degrees Celsius to about 400 degrees Celsius.

A gate capping layer GC is formed on the gate electrode GE to cover upper and side surfaces of the gate electrode GE. The gate capping layer GC is formed on the gate line GL to cover upper and side surfaces of the gate line GL. The gate capping layer GC may include graphene. For example, graphene is selectively grown on the gate electrode GE and the gate line GL to form the gate capping layer GC. When the gate electrode GE and the gate line GL include copper (Cu), the gate capping layer GC may be formed under a condition that graphene selectively grows on a surface of copper. For example, the gate capping layer GC may be formed by a acetylene (C2H2) chemical vapor deposition (CVD) process in an argon (Ar) atmosphere at a temperature of about 300 degree Celsius to about 400 degrees Celsius.

The source electrode SE, the drain electrode DE and the gate capping layer GC may be formed at substantially the same time. The source electrode SE, the drain electrode DE and the gate capping layer GC may be formed under a condition that graphene selectively grows on both of a surface of copper and a surface of indium gallium zinc oxide. For example, the source electrode SE, the drain electrode DE and the gate capping layer GC may be substantially simultaneously formed by a acetylene (C2H2) chemical vapor deposition (CVD) process in an argon (Ar) atmosphere at a temperature of about 300 degrees Celsius to about 400 degrees Celsius.

Figure 7J:
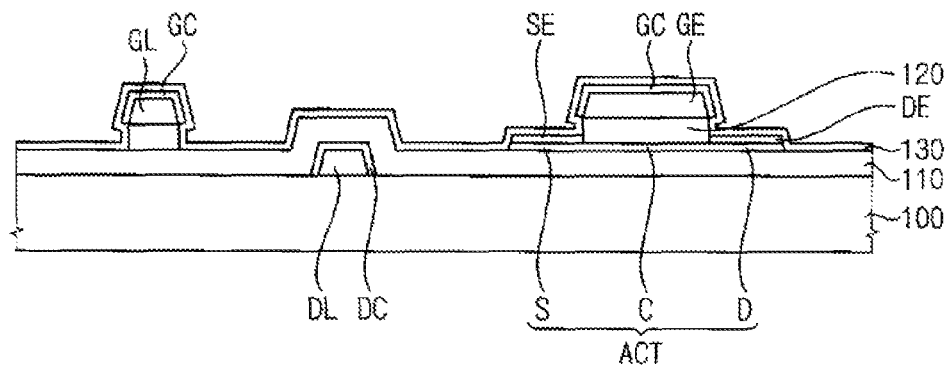

Referring to FIG. 7J, a passivation layer 130 is formed on the gate capping layer GC, the source electrode SE, the drain electrode DE and the first insulation layer 110. The passivation layer 130 may include at least one of silicon nitride (SiNx), silicon oxide (SiOx) and aluminum oxide. For example, the passivation layer 130 includes silicon nitride (SiNx) and has a thickness of about 2000 Å.

Figure 7K:
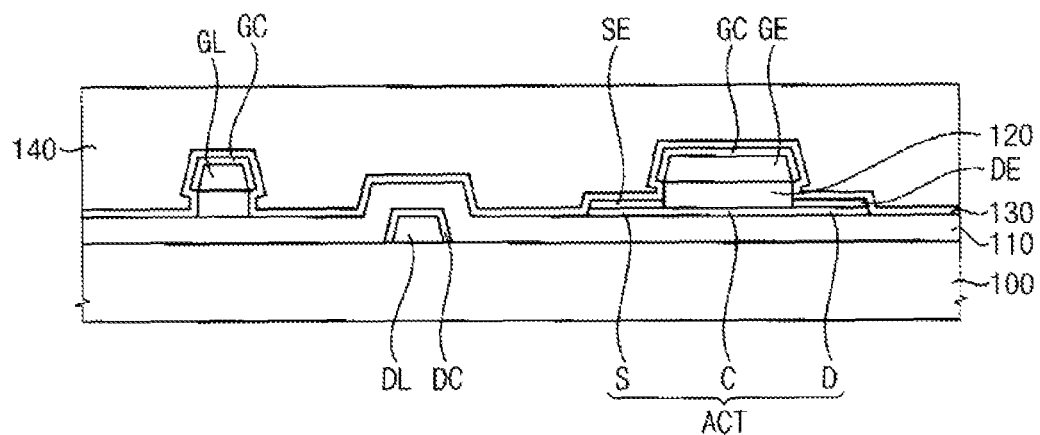

Referring to FIG. 7K, a planarizing layer 140 is formed on the passivation layer 130. The planarizing layer 140 may include an organic insulation material. A photoresist composition may be coated on the passivation layer 130 through a spin coating process to form the planarizing layer 140.

Figure 7L:
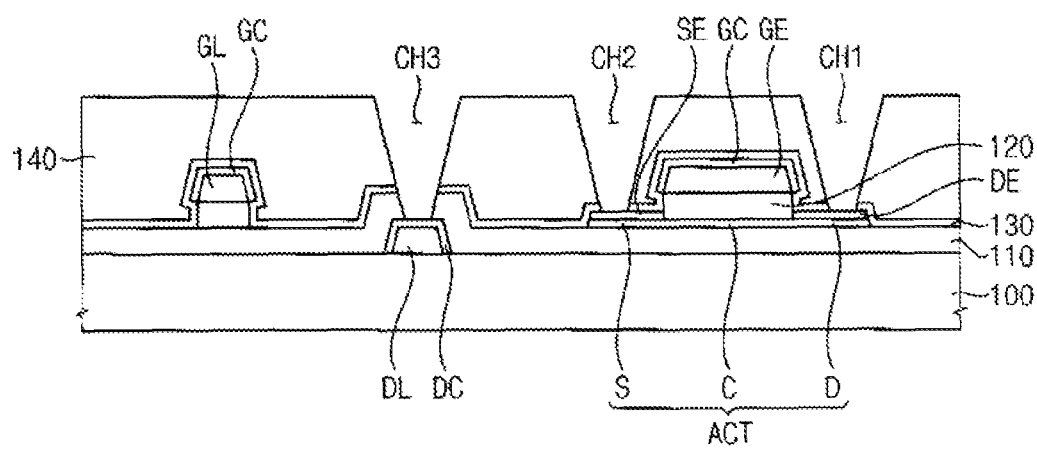

Referring to FIG. 7L, a first contact hole CH1, a second contact hole CH2, and a third contact hole CH3 are formed.

The first contact hole CH1 is formed through the planarizing layer 140 and the passivation layer 130 and exposes a portion of the drain electrode DE. The second contact hole CH2 is formed through the planarizing layer 140 and the passivation layer 130 and exposes a portion of the source electrode SE. The third contact hole CH3 is formed through the planarizing layer 140, the passivation layer 130 and the first insulation layer 110 and exposes a portion of the data capping layer DC on the data line DL.

Figure 7M:
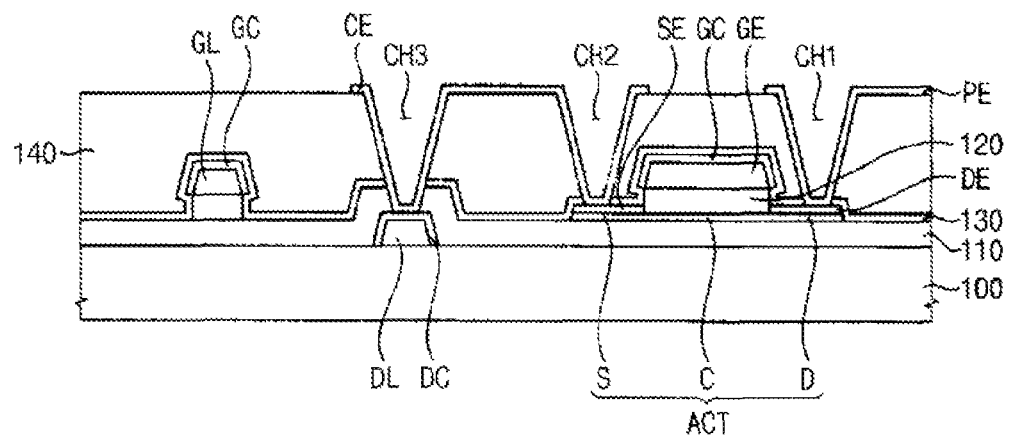

Referring to FIG. 7M, a pixel electrode PE and a connecting electrode CE are disposed on the planarizing layer 140. A transparent conductive layer is formed on the planarizing layer 140. Thereafter, the pixel electrode PE and the connecting electrode CE are formed by pattering the transparent conductive layer. The transparent conductive layer may include a transparent conductive material, such as indium tin oxide (ITO), indium zinc oxide (IZO) and etc.

FIGS. 8A to 8I are cross-sectional views illustrating a method of manufacturing the display substrate of FIGS. 3 and 4.

Figure 8A:
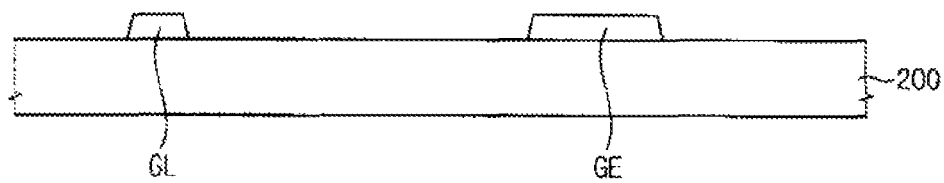
FIGS. 8A to 8I are cross-sectional views illustrating a method of manufacturing the display substrate of FIGS. 3 and 4.

Referring to FIG. 8A, a gate metal layer is formed on a base substrate 200. Examples of the base substrate 200 may include a glass substrate, a quartz substrate, a silicon substrate, a plastic substrate or the like. The gate metal layer may be formed by a sputtering process, or the like.

The gate metal layer may have a single layer structure including one or more of copper (Cu), silver (Ag), chrome (Cr), molybdenum (Mo), aluminum (Al), titanium (Ti), and manganese (Mn). The gate metal layer may have a multi-layer structure having a plurality of layers including materials different from each other.

A gate line GL and a gate electrode GE are formed by patterning the gate metal layer. For example, a photoresist composition is coated on the gate metal layer to form a photoresist pattern having a shape corresponding to the gate line GL and the gate electrode GE. Thereafter, the gate metal layer, which is not covered by the photoresist pattern, is etched to form the gate line GL and the gate electrode GE.

Figure 8B:
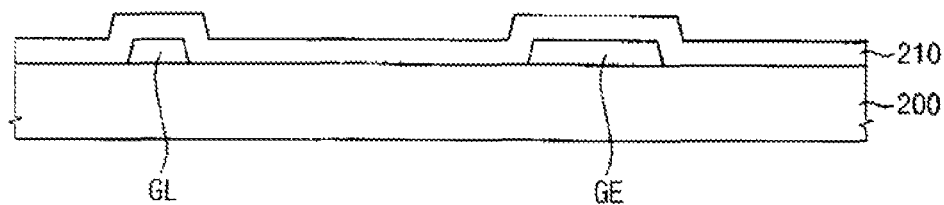

Referring to FIG. 8B, a first insulation layer 210 is formed covering the base substrate 200, the gate line GL and the gate electrode GE. The first insulation layer 210 may include an inorganic insulating material. For example, the first insulation layer 210 may include silicon oxide (SiOx) and have a thickness of about 2000 Å.

Figure 8C:
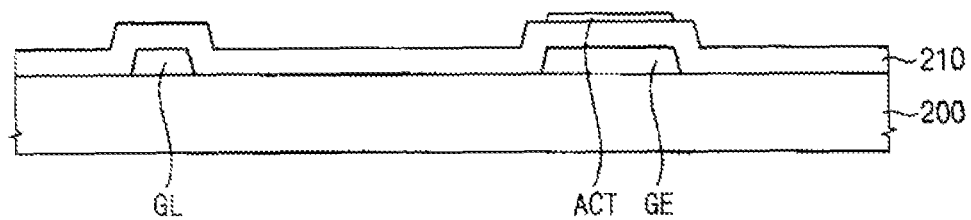

Referring to FIG. 8C, an active pattern ACT is formed on the first insulation layer 210. For example, an active layer may be formed on the first insulation layer 210. Thereafter, the active pattern ACT is formed by patterning the active layer. (refers to, e.g., FIGS. 7D and 7E)

Figure 8D:
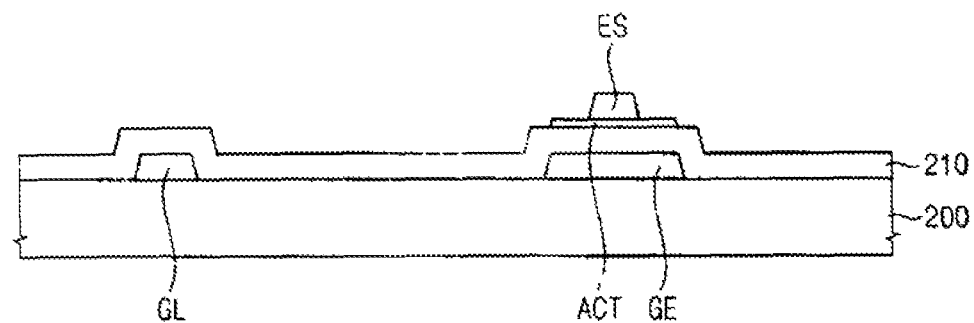

Referring to FIG. 8D, an etch stopper ES is formed on the active pattern ACT. For example, an insulation layer may be formed on the active pattern ACT. Thereafter, the etch stopper ES may be formed by patterning the insulation layer. The etch stopper ES exposes a portion of the active pattern ACT.

Figure 8E:
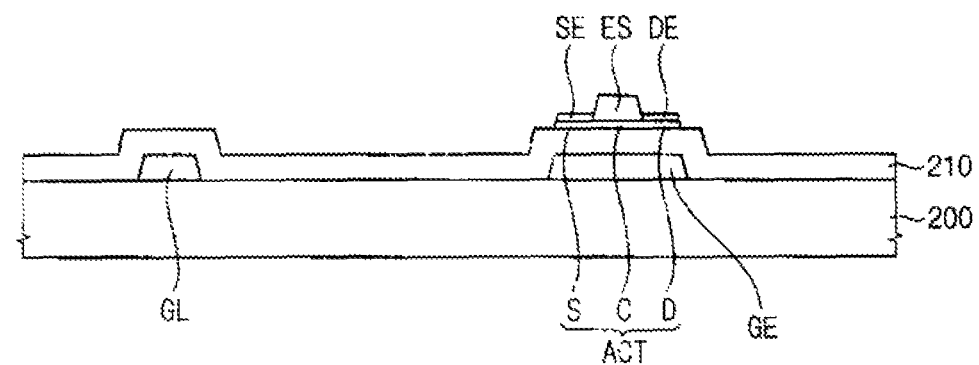

Referring to FIG. 8E, the active pattern ACT includes a channel portion C covered by the etch stopper ES, and source and drain portions exposed by the etch stopper ES.

A source electrode SE and a drain electrode DE are formed on the source portion S and the drain portion D, respectively, of the active pattern ACT. The source electrode SE and the drain electrode DE may include graphene. For example, graphene is selectively grown on the source portion S and the drain portion D of the active pattern ACT to form the source electrode SE and the drain electrode DE. When the active pattern ACT includes indium gallium zinc oxide (IGZO), the source electrode SE and the drain electrode DE may be formed under a condition that graphene selectively grows on a surface of indium gallium zinc oxide. For example, the source electrode SE and the drain electrode DE may be formed by a acetylene (C2H2) chemical vapor deposition (CVD) process in an argon (Ar) atmosphere at a temperature of about 300 degrees Celsius to about 400 degrees Celsius.

Figure 8F:
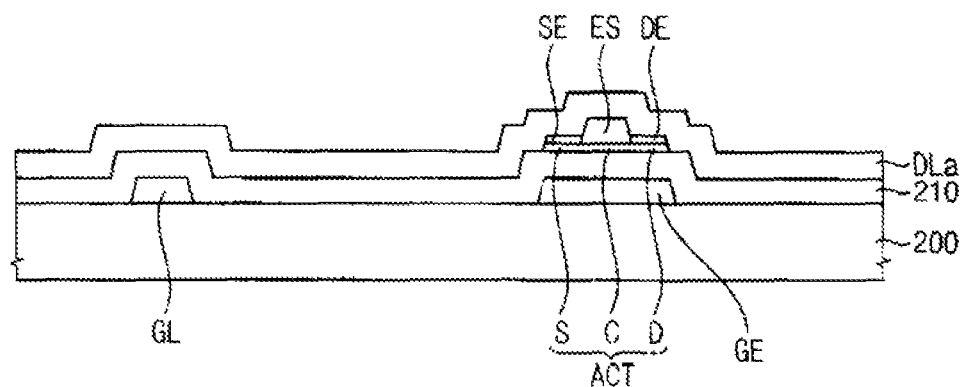
Figure 8G:
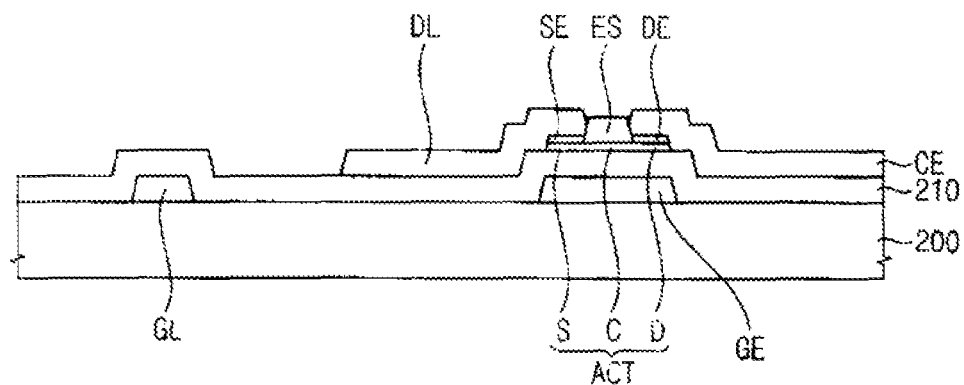

Referring to FIG. 8F, a data metal layer DLa is formed on the source electrode SE, the drain electrode DE and the etch stopper ES. The data metal layer DLa may have a single layer structure including one or more of copper (Cu), silver (Ag), chrome (Cr), molybdenum (Mo), aluminum (Al), titanium (Ti), and manganese (Mn). The data metal layer DLa may have a multi-layer structure having a plurality of layers including materials different from each other.

Referring to FIG. 8Q a data line, and a connecting electrode CE spaced apart from the data line are formed by patterning the data metal layer DLa. For example, a photoresist composition is coated on the data metal layer DLa to form a photoresist pattern having a shape corresponding to the data line DL and the connecting electrode CE. Thereafter, the data metal layer DLa, which is not covered by the photoresist pattern, is etched to form the data line DL and the connecting electrode CE. The etch stopper ES prevents the active pattern ACT from being damaged.

Figure 8H:
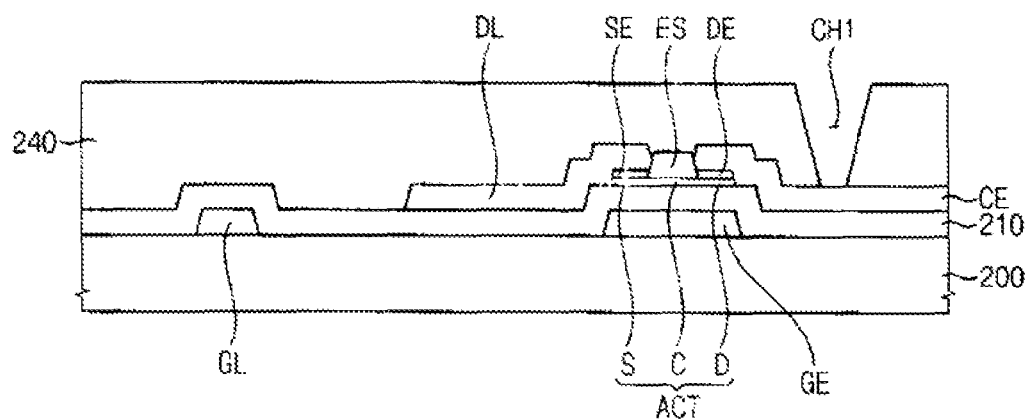

Referring to FIG. 8H, a second insulation layer 240 is formed on the first insulation layer 210, the drain electrode DE, the connecting electrode CE and the etch stopper ES. The second insulation layer 240 may include a plurality of layers. For example, the second insulation layer 240 may include an inorganic insulation layer and an organic insulation layer disposed on the inorganic insulation layer.

The first contact hole CH1 is formed through the second insulation layer 240 and exposes a portion of the connecting electrode CE.

Figure 8I:
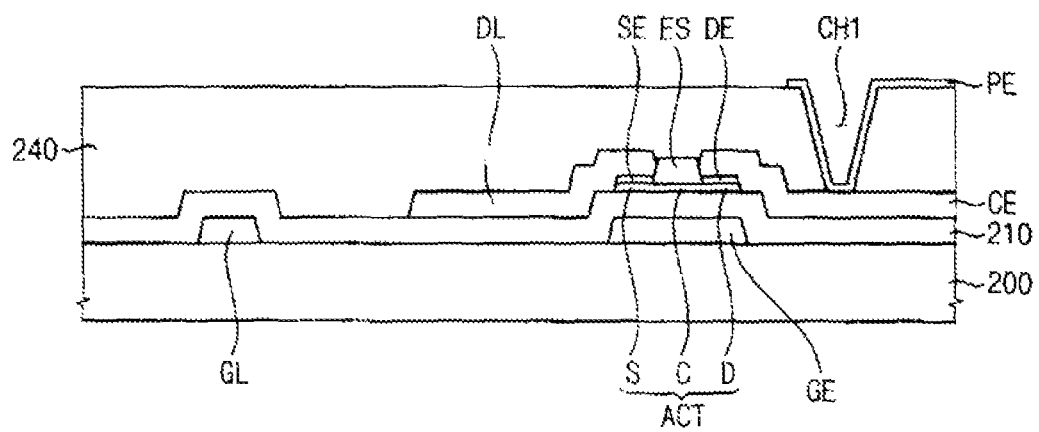

Referring to FIG. 8I, a pixel electrode PE is formed on the second insulation layer 240. A transparent conductive layer is formed on the second insulation layer 240. Thereafter, the pixel electrode PE is formed by patterning the transparent conductive layer. The transparent conductive layer may include a transparent conductive material, such as indium tin oxide (ITO), indium zinc oxide (IZO) and etc.

FIGS. 9A to 9I are cross-sectional views illustrating a method of manufacturing the display substrate of FIGS. 5 and 6.

Figure 9A:
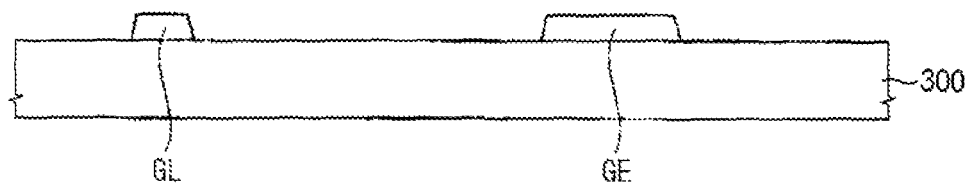
FIGS. 9A to 9I are cross-sectional views illustrating a method of manufacturing the display substrate of FIGS. 5 and 6.

Referring to FIG. 9A, a gate metal layer is formed on a base substrate 300. Examples of the base substrate 300 may include a glass substrate, a quartz substrate, a silicon substrate, a plastic substrate or the like. The gate metal layer may be formed by a sputtering process, or the like.

The gate metal layer may have a single layer structure including one or more of copper (Cu), silver (Ag), chrome (Cr), molybdenum (Mo), aluminum (Al), titanium (Ti), and manganese (Mn). The gate metal layer may have a multi-layer structure having a plurality of layers including materials different from each other.

A gate line GL and a gate electrode GE are formed by patterning the gate metal layer. For example, a photoresist composition is coated on the gate metal layer to form a photoresist pattern having a shape corresponding to the gate line GL and the gate electrode GE. Thereafter, the gate metal layer, which is not covered by the photoresist pattern, is etched to form the gate line GL and the gate electrode GE.

Figure 9B:
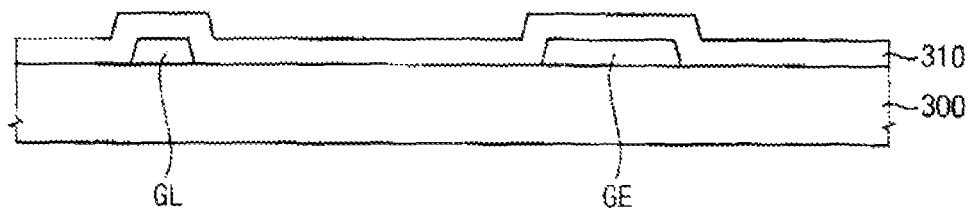

Referring to FIG. 9B, a first insulation layer 310 is formed covering the base substrate 300, the gate line GL and the gate electrode GE. The first insulation layer 310 may include an inorganic insulating material. For example, the first insulation layer 310 may include silicon oxide (SiOx) and have a thickness of about 2000 Å.

Figure 9C:
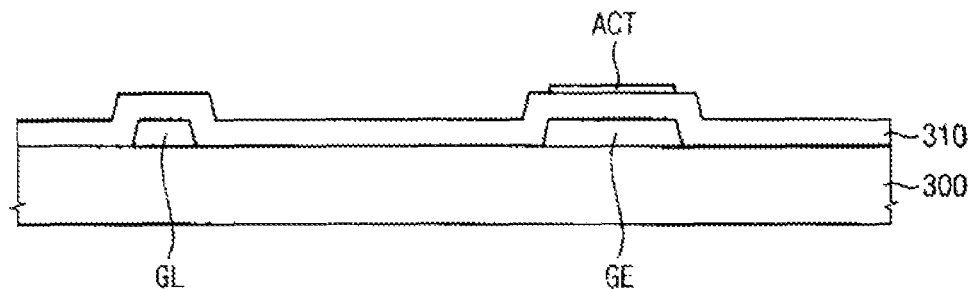

Referring to FIG. 9C, an active pattern ACT is formed on the first insulation layer 310. For example, an active layer may be formed on the first insulation layer 310. Thereafter, the active pattern ACT is formed by patterning the active layer. (refers to FIGS. 7D and 7E)

Figure 9D:
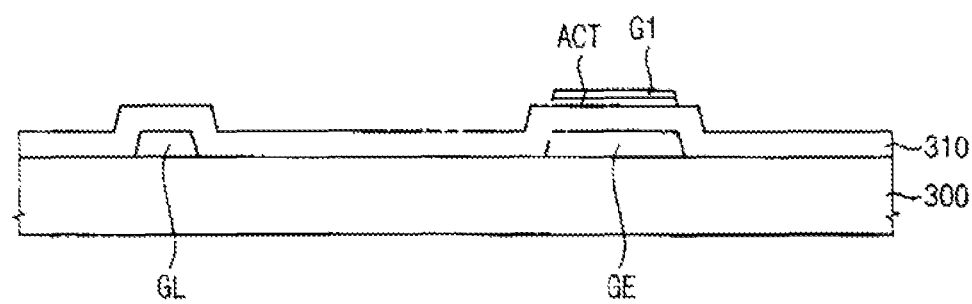

Referring to FIG. 9D, an electrode layer G1 is formed on the active pattern ACT. The electrode layer G1 may include graphene. For example, electrode layer G1 may be formed on the active pattern ACT. When the active pattern ACT includes indium gallium zinc oxide (IGZO), the electrode layer G1 may be formed under a condition that graphene selectively grows on a surface of indium gallium zinc oxide. For example, the electrode layer G1 may be formed by a acetylene (C2H2) chemical vapor deposition (CVD) process in an argon (Ar) atmosphere at a temperature of about 300 degrees Celsius to about 400 degrees Celsius.

Figure 9E:
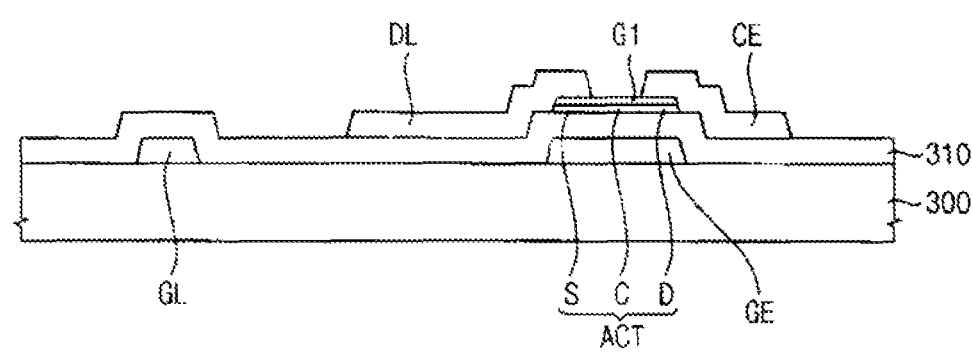

Referring to FIG. 9E, a data line DL and a connecting electrode CE are formed on the first insulation layer 310 and the electrode layer G1. A data metal layer may be formed on the first insulation layer 310 and the electrode layer G1.

Thereafter, the data line DL and the connecting electrode CE may be formed by pattering the data metal layer. The data line DL covers a portion of the electrode layer G1 on a source portion S of the active pattern ACT. The connecting electrode CE covers a portion of the electrode layer G1 on a drain portion D of the active pattern ACT. A portion of the electrode layer G1 corresponding to a channel portion C of the active pattern ACT is exposed. While the data metal layer is patterned, the electrode layer G1 may be partially exposed. However, the data metal layer includes a material different from the electrode layer G1, and the portion of the electrode layer G1 corresponding to the channel portion C is not etched due to etching selectivity.

Figure 9F:
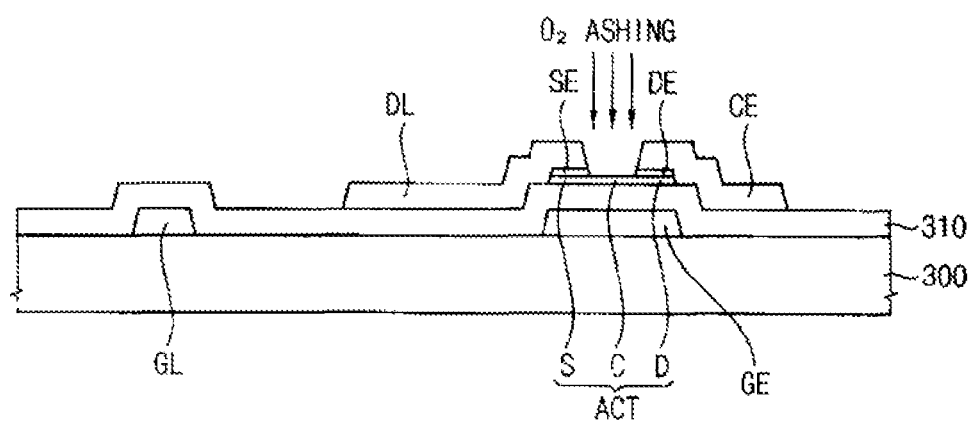

Referring to FIG. 9F, the portion of the electrode layer G1 corresponding to the channel portion C is removed. For example, when the electrode layer G1 includes graphene, the portion of the electrode layer G1 may be removed by an oxygen (02) ashing process. Thus, the electrode layer G1 turns into a source electrode SE and a drain electrode DE.

Figure 9G:
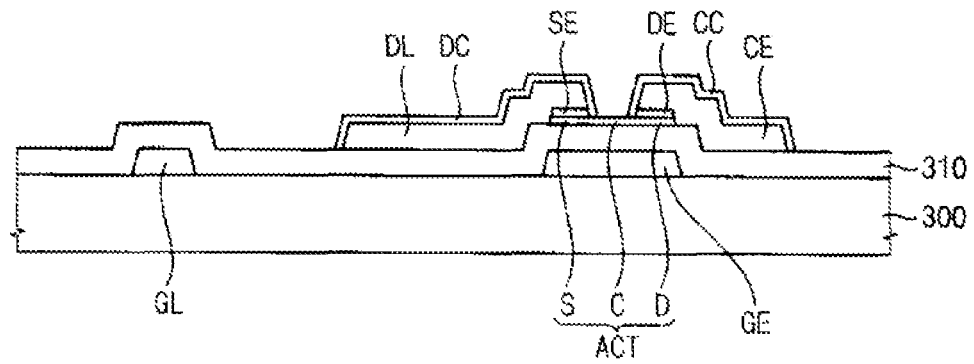

Referring to FIG. 9G, a data capping layer DC is formed on the data line DL. A connecting electrode capping layer CC is formed on the connecting electrode CE.

The data capping layer DC and the connecting electrode capping layer CC may include graphene. For example, graphene is selectively grown on the data line DL and connecting electrode CE to form the data capping layer DC and the connecting electrode capping layer CC. When the data line DL and connecting electrode CE include copper (Cu), the data capping layer DC and the connecting electrode capping layer CC may be formed under a condition that graphene selectively grows on a surface of copper.

The graphene does not grow on the active pattern ACT. For example, when the active pattern ACT includes indium gallium zinc oxide (IGZO), the data capping layer DC and the connecting electrode capping layer CC may be formed under a condition that graphene selectively grows on a surface of copper, but not on a surface of the indium gallium zinc oxide. For example, the data capping layer DC and the connecting electrode capping layer CC may be formed by a acetylene (C2H2) chemical vapor deposition (CVD) process in an atmosphere of argon (Ar) and hydrogen (H2) at a temperature of about 300 degrees Celsius to about 400 degrees Celsius.

Figure 9H:
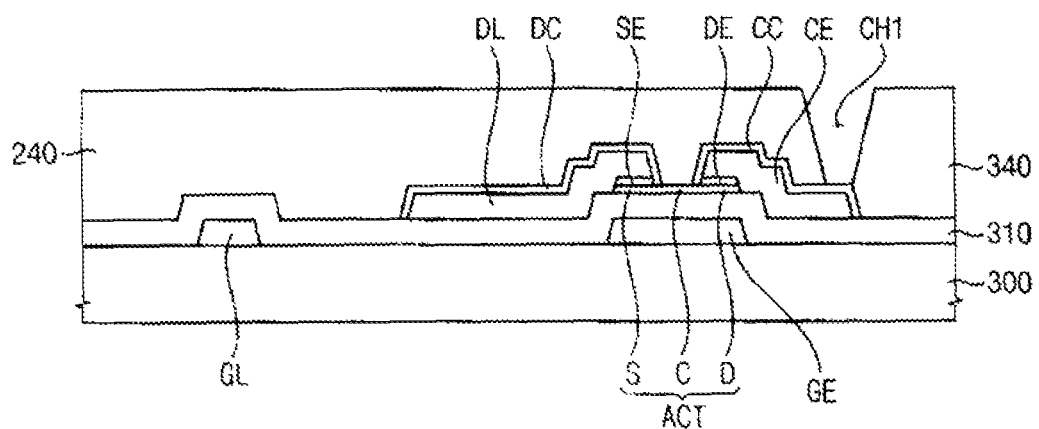

Referring to FIG. 9H, a second insulation layer 340 is formed on the first insulation layer 310, the active pattern ACT, the data capping layer DC and the connecting electrode capping layer CC. The second insulation layer 340 may include a plurality layers. For example, the second insulation layer 340 may include an inorganic insulation layer and an organic insulation layer disposed on the inorganic insulation layer.

The first contact hole CH1 is formed through the second insulation layer 340 and exposes a portion of the connecting electrode capping layer CC.

Figure 9I:
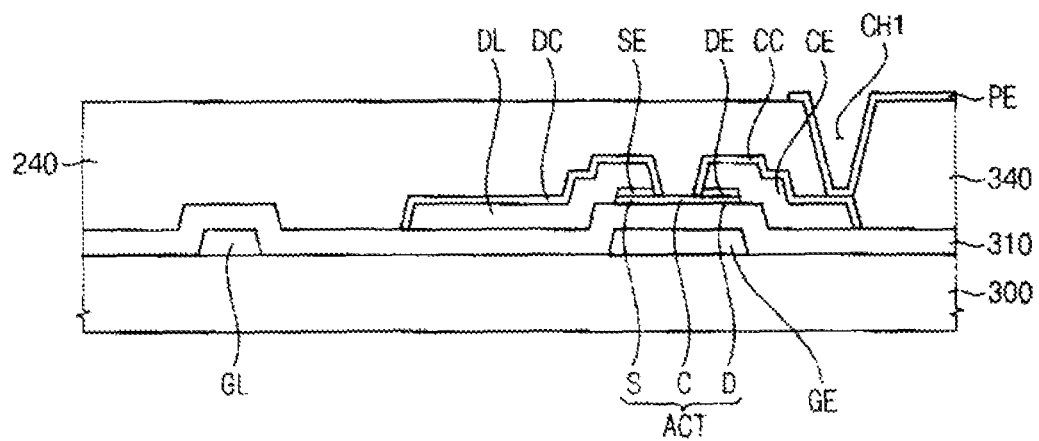

Referring to FIG. 9I, a pixel electrode PE is formed on the second insulation layer 340. A transparent conductive layer is formed on the second insulation layer 340. Thereafter, the pixel electrode PE is formed by patterning the transparent conductive layer. The transparent conductive layer may include a transparent conductive material, such as indium tin oxide (ITO), indium zinc oxide (IZO), etc.

According to exemplary embodiments of the present invention, a switching element includes a source electrode and a drain electrode disposed on an active pattern including an oxide semiconductor. Thus, the active pattern makes ohmic contact with the source and drain electrodes, and superior electrical properties of the switching element may be thus achieved.

The source electrode and the drain electrode include graphene, thus resulting in a simplified manufacturing process and superior electrical properties of the switching element.

Although exemplary embodiments of the invention have been described, it is understood that the present invention should not be limited to these exemplary embodiments and various changes and modifications can be made by one of ordinary skill in the art within the spirit and scope of the present invention as hereinafter claimed.

What is claimed is:

1. A switching element comprising:
an active pattern comprising a channel portion, a source portion connected to the channel portion, and a drain portion connected to the channel portion, wherein the source portion, the drain portion, and the channel portion of the active pattern each comprise at least one common material;
a gate electrode overlapping the channel portion of the active pattern;
a gate insulation layer disposed between the channel portion of the active pattern and the gate electrode;
a source electrode disposed on the source portion of the active pattern, wherein the source electrode makes ohmic contact with the source portion, and wherein the source electrode includes a graphene layer in direct physical contact with the source portion; and
a drain electrode disposed on the drain portion of the active pattern, wherein the drain electrode makes ohmic contact with the drain portion, and wherein the drain electrode includes a graphene layer in direct physical contact with the drain portion.

2. The switching element of claim 1, wherein the gate insulation layer is disposed between the source electrode and the drain electrode, and wherein
a boundary of the gate insulation layer substantially coincides with a boundary of the gate electrode.

3. The switching element of claim 1, further comprising a gate capping layer disposed on the gate electrode, the gate capping layer covering upper and side surfaces of the gate electrode, and
wherein the gate capping layer is electrically insulated from the source electrode and the drain electrode.

4. The switching element of claim 3, wherein the gate capping layer comprises graphene.

5. The switching element of claim 1, further comprising an etch stopper disposed on the channel portion of the active pattern, the etch stopper contacting the channel portion, and
wherein the etch stopper is disposed between the source electrode and the drain electrode and insulates the source electrode from the drain electrode.

6. The switching element of claim 1, wherein the active pattern comprises an amorphous oxide having one or more of indium (In), zinc (Zn), gallium (Ga), and hafnium (Hf).

7. The switching element of claim 1, wherein the gate electrode is disposed opposite to the source electrode and the drain electrode with respect to the active pattern.

8. The switching element of claim 1, wherein a size of the active pattern is larger than a size of the gate electrode when viewed in a plan view.

9. A display substrate comprising:
a base substrate;
a data line disposed on the base substrate;
a gate line crossing the data line;
a switching element electrically connected to the gate line and the data line; and a pixel electrode electrically connected to the switching element, the switching element comprising:

an active pattern comprising a channel portion, a source portion connected to the channel portion, and a drain portion connected to the channel portion, wherein the source portion, the drain portion, and the channel portion of the active pattern each comprise at least one common material;

a gate electrode overlapping the channel portion of the active pattern;

a gate insulation layer disposed between the channel portion of the active pattern and the gate electrode;

a source electrode disposed on the source portion of the active pattern, the source electrode making ohmic contact with the source portion, and wherein the source electrode includes a graphene layer in direct physical contact with the source portion; and a drain electrode disposed on the drain portion of the active pattern, the drain electrode making ohmic contact with the drain portion, and wherein the drain electrode includes a graphene layer in direct physical contact with the drain portion.

10. The switching element of claim 9, further comprising an etch stopper disposed on the channel portion of the active pattern, the etch stopper contacting the channel portion, and wherein the etch stopper is disposed between the source electrode and the drain electrode and insulates the source electrode from the drain electrode.

11. The display substrate of claim 9, further comprising a gate capping layer covering upper and side surfaces of the gate line and upper and side surfaces of the gate electrode, and wherein the gate capping layer, the source electrode, and the drain electrode comprise at least one common material.

12. The switching element of claim 11, further comprising a passivation layer covering the gate capping layer, the source electrode and the drain electrode, and wherein the pixel electrode is electrically connected to the drain electrode through a first contact hole formed through the passivation layer.

13. The switching element of claim 11, further comprising a data capping layer covering upper and side surfaces of the data line and comprising graphene.

14. The switching element of claim 11, wherein the active pattern comprises amorphous oxide having one or more of indium (In), zinc (Zn), gallium (Ga), and hafnium (Hf).

15. A switching element comprising:

an active pattern;

a source electrode and a drain electrode each disposed on the active pattern, wherein the source and drain electrodes are each configured to form ohmic contact with the active pattern;

an insulating layer disposed on the active pattern between the source electrode and the drain electrode; and a gate electrode disposed on the insulating layer, wherein at least one of the source electrode and the drain electrode includes a graphene layer in direct physical contact with a portion of the active pattern.

16. The switching element of claim 15, further comprising a graphene layer disposed on the gate electrode.

* * * * *